(12) United States Patent
Wang et al.

(10) Patent No.: US 10,964,838 B2
(45) Date of Patent: Mar. 30, 2021

(54) DISPLAY SUBSTRATE AND MANUFACTURING METHOD THEREOF, DISPLAY PANEL, AND DISPLAY DEVICE

(71) Applicant: BOE Technology Group Co., Ltd., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/516,290

(22) Filed: Jul. 19, 2019

(65) Prior Publication Data

US 2020/0075570 A1    Mar. 5, 2020

(30) Foreign Application Priority Data

Aug. 30, 2018  (CN) .......................... 2018 1 1007361

(51) Int. Cl.
| | | |
|---|---|---|
| *H01L 31/14* | (2006.01) | |
| *H01L 25/18* | (2006.01) | |
| *H01L 27/144* | (2006.01) | |
| *H01L 31/12* | (2006.01) | |

(52) U.S. Cl.
CPC .............. *H01L 31/14* (2013.01); *H01L 25/18* (2013.01); *H01L 27/1443* (2013.01); *H01L 27/1446* (2013.01); *H01L 31/12* (2013.01)

(58) Field of Classification Search
CPC ... H01L 27/32; H01L 27/322; H01L 27/3225; H01L 27/3227; H01L 27/3234; H01L 27/3246; H01L 27/3251; H01L 27/3253; H01L 27/326; H01L 27/3262; H01L 27/3269; H01L 27/3272; H01L 31/12; H01L 31/14; H01L 31/16; H01L 31/165; H01L 31/167; H01L 25/167; G06F 3/04; G06F 3/041; G06F 3/042; G06F 3/0412; G06F 2203/04103; G06K 9/0004
See application file for complete search history.

(56) References Cited

U.S. PATENT DOCUMENTS

| | | | |
|---|---|---|---|
| 6,243,155 B1 * | 6/2001 | Zhang | G02F 1/135 |
| | | | 257/57 |
| 7,242,449 B1 * | 7/2007 | Yamazaki | G02F 1/1362 |
| | | | 349/116 |
| 8,154,480 B2 * | 4/2012 | Shishido | H01L 27/14609 |
| | | | 345/76 |

(Continued)

*Primary Examiner* — Eduardo A Rodela
(74) *Attorney, Agent, or Firm* — Fay Sharpe LLP

(57) ABSTRACT

The present disclosure discloses a display substrate, a manufacturing method thereof, a display panel, and a display device. The display substrate includes a base substrate, a black matrix disposed on the base substrate, and a switching unit and an optical detection unit that are disposed at a side of the black matrix away from the base substrate. The optical detection unit is electrically connected to the switching unit, and an orthographic projection of at least one of the switching unit and the optical detection unit on the base substrate is located in an orthographic projection of the black matrix on the base substrate. Since the orthographic projection of at least one of the switching unit and the optical detection unit on the base substrate is located in the orthographic projection of the black matrix on the base substrate, the aperture ratio of the display substrate may increase.

18 Claims, 17 Drawing Sheets

(56) References Cited

U.S. PATENT DOCUMENTS

| | | | | |
|---|---|---|---|---|
| 8,378,443 B2* | 2/2013 | Yamazaki | ............ | H01L 51/0097 |
| | | | | 257/443 |
| 9,159,866 B2* | 10/2015 | Lee | ...................... | H01L 31/1055 |
| 9,997,543 B2* | 6/2018 | Arao | ................. | H01L 29/78603 |
| 10,141,357 B2* | 11/2018 | Miyamoto | ......... | H01L 27/14623 |
| 10,545,616 B2* | 1/2020 | Wang | .................... | G06K 9/0004 |
| 2008/0237665 A1* | 10/2008 | Shishido | ................. | H01L 23/60 |
| | | | | 257/290 |
| 2009/0032823 A1* | 2/2009 | Im | ............................ | G01J 1/02 |
| | | | | 257/80 |
| 2010/0102301 A1* | 4/2010 | Yang | ................... | H01L 27/3258 |
| | | | | 257/40 |
| 2010/0328269 A1* | 12/2010 | Kurokawa | .............. | G06F 3/042 |
| | | | | 345/175 |
| 2011/0043473 A1* | 2/2011 | Kozuma | ................. | G06F 3/042 |
| | | | | 345/173 |
| 2014/0184577 A1* | 7/2014 | Kim | ........................ | G02F 1/163 |
| | | | | 345/207 |
| 2018/0005007 A1* | 1/2018 | Du | ........................ | G06K 9/2036 |
| 2018/0025200 A1* | 1/2018 | Frye | ........................ | G06F 21/32 |
| | | | | 257/9 |

* cited by examiner

DISPLAY SUBSTRATE AND MANUFACTURING METHOD THEREOF, DISPLAY PANEL, AND DISPLAY DEVICE

CROSS-REFERENCE TO RELATED APPLICATION

This application claims priority to Chinese Patent Application No.: 201811007361.3 filed on Aug. 30, 2018 and entitled "OLED DISPLAY SUBSTRATE AND MANUFACTURING METHOD THEREOF, AND OLED DISPLAY PANEL", the entire contents of which are incorporated herein by reference.

TECHNICAL FIELD

The present disclosure relates to a display substrate and a manufacturing method thereof, a display panel, and a display device.

BACKGROUND

Organic light emitting diode (OLED) display panels are novel display panels in the market. The OLED display panel has self-emitting characteristic. Thus, compared with the liquid crystal display panel, the OLED display panel has many advantages, such as wide color gamut, high contrast, and ultra lightness and thinness.

SUMMARY

The present disclosure provides a display substrate and a manufacturing method thereof, a display panel, and a display device.

In an aspect, there is provided a display substrate, comprising: a base substrate; a black matrix on the base substrate; and a switching unit and an optical detection unit at a side of the black matrix away from the base substrate, wherein the optical detection unit is electrically connected to the switching unit, and an orthographic projection of at least one of the switching unit and the optical detection unit on the base substrate is within an orthographic projection of the black matrix on the base substrate.

Optionally, an orthographic projection of the switching unit on the base substrate and an orthographic projection of the optical detection unit on the base substrate are both within an orthographic projection of the black matrix on the base substrate.

Optionally, the display substrate further comprises: a color filter layer at a side of the switching unit away from the black matrix, wherein an orthographic projection of the color filter layer on the base substrate is staggered from an orthographic projection of the optical detection unit on the base substrate.

Optionally, the switching unit comprises: an active layer, wherein an orthographic projection of the active layer on the base substrate is within the orthographic projection of the color filter layer on the base substrate.

Optionally, the display substrate further comprises: a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit.

Optionally, the switching unit comprises: a first electrode and a second electrode, wherein the optical detection unit is electrically connected to one of the first electrode and the second electrode, and the auxiliary connection trace, the first electrode, and the second electrode are disposed in the same layer.

Optionally, the switching unit is a thin film transistor, and comprises an active layer, a gate insulating layer, a gate electrode, an interlayer dielectric layer, and a source-drain electrode layer that are sequentially distributed in a direction away from the black matrix, wherein the source-drain electrode layer comprises a source electrode and a drain electrode, the first electrode is the source electrode, the second electrode is the drain electrode, and the optical detection unit is electrically connected to the second electrode.

Optionally, the optical detection unit is a photodiode, and a photosensitive surface of the optical detection unit is a surface of the optical detection unit away from the black matrix.

Optionally, the switching unit and the optical detection unit are distributed in a direction away from the black matrix, and the display substrate further comprises: a passivation layer at a side of the switching unit away from the black matrix, wherein the passivation layer has a via-hole and at least part of the optical detection unit is in the via hole.

Optionally, the display substrate further comprises:
an insulating layer between the black matrix and the switching unit, and a protective layer, a first auxiliary cathode, a supporting column, and a second auxiliary cathode at a side of the color filter layer away from the base substrate, wherein the protective layer, the first auxiliary cathode, the supporting column, and the second auxiliary cathode are distributed in a direction away from the base substrate, and the first auxiliary cathode is electrically connected to the second auxiliary cathode.

Optionally, the switching unit and the optical detection unit are distributed in a direction away from the base substrate, and the display substrate further comprises: a passivation layer at a side of the switching unit away from the black matrix, wherein the passivation layer has a via-hole and at least part of the optical detection unit is in the via hole; a color filter layer at a side of the passivation layer away from the switching unit, wherein an orthographic projection of the color filter layer on the base substrate is staggered from an orthographic projection of the optical detection unit on the base substrate; a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit; and an insulating layer between the black matrix and the switching unit, and a protective layer, a first auxiliary cathode, a supporting column and a second auxiliary cathode at a side of the color filter layer away from the base substrate, wherein the protective layer, the first auxiliary cathode, the supporting column and the second auxiliary cathode are distributed in a direction away from the base substrate, and the first auxiliary cathode is electrically connected to the second auxiliary cathode; wherein the switching unit is a thin film transistor and comprises an active layer, a gate insulating layer, a gate electrode, an interlayer dielectric layer, and a source-drain electrode layer that are sequentially distributed in a direction away from the black matrix, wherein an orthographic projection of the active layer on the base substrate is within an orthographic projection of the color filter layer on the base substrate, and the source-drain electrode layer comprises a source electrode and a drain electrode; the optical detection unit is electrically connected to the drain electrode; the auxiliary connection trace, the source electrode, and the drain electrode are distributed in the same layer; the optical detection unit is a photodiode, and a photosensitive surface of the optical detection unit is a surface of the optical detection unit away from the black matrix.

In another aspect, there is provided a method for manufacturing a display substrate, comprising: forming a black matrix on a base substrate; forming a switching unit at a side of the black matrix away from the base substrate; and forming an optical detection unit at a side of the switching unit away from the black matrix, wherein the optical detection unit is electrically connected to the switching unit, and an orthographic projection of at least one of the switching unit and the optical detection unit on the base substrate is within an orthographic projection of the black matrix on the base substrate.

Optionally, the method further comprises: forming a color filter layer at a side of the switching unit away from the black matrix, wherein an orthographic projection of the color filter layer on the base substrate is staggered from an orthographic projection of the optical detection unit on the base substrate.

Optionally, the method further comprises: forming a primary connection trace at a side of the optical detection unit away from the black matrix, wherein the primary connection trace is electrically connected to an auxiliary connection trace and the optical detection unit, respectively; and the switching unit comprises a first electrode and a second electrode, wherein the optical detection unit is electrically connected to one of the first electrode and the second electrode, and the auxiliary connection trace, the first electrode, and the second electrode are distributed in the same layer.

Optionally, prior to forming an optical detection unit at a side of the switching unit away from the black matrix, the method further comprises: forming a passivation layer at a side of the switching unit away from the black matrix, wherein the passivation layer has a via-hole; and forming an optical detection unit at a side of the switching unit away from the black matrix comprises: forming an optical detection unit at a side of the switching unit away from the black matrix, wherein at least part of the optical detection unit is in the via-hole.

Optionally, prior to forming a switching unit at a side of the black matrix away from the base substrate, the method further comprises: forming an insulating layer at a side of the black matrix away from the base substrate; forming a switching unit at a side of the black matrix away from the base substrate comprises: forming a switching unit at a side of the insulating layer away from the black matrix; and after forming a color filter layer at a side of the switching unit away from the black matrix, the method further comprises: sequentially forming a protective layer, a first auxiliary cathode, a supporting column and a second auxiliary cathode at a side of the color filter layer away from the base substrate, wherein the first auxiliary cathode is electrically connected to the second auxiliary cathode.

In yet another aspect, there is provided a display panel, comprising: a display substrate; wherein the display substrate comprises: a base substrate; a black matrix on the base substrate; and a switching unit and an optical detection unit at a side of the black matrix away from the base substrate, wherein the optical detection unit is electrically connected to the switching unit, and an orthographic projection of at least one of the switching unit and the optical detection unit on the base substrate is within an orthographic projection of the black matrix on the base substrate.

Optionally, an orthographic projection of the switching unit on the base substrate and an orthographic projection of the optical detection unit on the base substrate are both within an orthographic projection of the black matrix on the base substrate.

Optionally, the display substrate further comprises: a color filter layer at a side of the switching unit away from the black matrix, wherein an orthographic projection of the color filter layer on the base substrate is staggered from an orthographic projection of the optical detection unit on the base substrate.

Optionally, the switching unit comprises: an active layer, wherein an orthographic projection of the active layer on the base substrate is within the orthographic projection of the color filter layer on the base substrate.

Optionally, the display substrate further comprises: a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit.

Optionally, the switching unit comprises: a first electrode and a second electrode, wherein the optical detection unit is electrically connected to one of the first electrode and the second electrode, and the auxiliary connection trace, the first electrode, and the second electrode are disposed in the same layer.

Optionally, the switching unit is a thin film transistor, and comprises an active layer, a gate insulating layer, a gate electrode, an interlayer dielectric layer, and a source-drain electrode layer that are sequentially distributed in a direction away from the black matrix, wherein the source-drain electrode layer comprises a source electrode and a drain electrode, the first electrode is the source electrode, the second electrode is the drain electrode, and the optical detection unit is electrically connected to the second electrode.

Optionally, the optical detection unit is a photodiode, and a photosensitive surface of the optical detection unit is a surface of the optical detection unit away from the black matrix.

Optionally, the switching unit and the optical detection unit are distributed in a direction away from the black matrix, and the display substrate further comprises: a passivation layer at a side of the switching unit away from the black matrix, wherein the passivation layer has a via-hole and at least part of the optical detection unit is in the via hole.

Optionally, the display substrate further comprises: an insulating layer between the black matrix and the switching unit, and a protective layer, a first auxiliary cathode, a supporting column, and a second auxiliary cathode at a side of the color filter layer away from the base substrate, wherein the protective layer, the first auxiliary cathode, the supporting column, and the second auxiliary cathode are distributed in a direction away from the base substrate, and the first auxiliary cathode is electrically connected to the second auxiliary cathode.

Optionally, the switching unit and the optical detection unit are distributed in a direction away from the base substrate, and the display substrate further comprises: a passivation layer at a side of the switching unit away from the black matrix, wherein the passivation layer has a via-hole and at least part of the optical detection unit is in the via hole; a color filter layer at a side of the passivation layer away from the switching unit, wherein an orthographic projection of the color filter layer on the base substrate is staggered from an orthographic projection of the optical detection unit on the base substrate; a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit; and an insulating layer between the black matrix and the switching unit, and a protective layer, a first auxiliary cathode, a supporting column and a second auxiliary cathode at a side of the color filter layer away from the base substrate, wherein the protective layer, the first auxiliary cathode, the supporting column and the second auxiliary cathode are distributed in a direction away from the base substrate, and the first auxiliary cathode is electrically connected to the second auxiliary cathode; wherein the switching unit is a thin film transistor and comprises an active layer, a gate insulating layer, a gate electrode, an interlayer dielectric layer, and a source-drain electrode layer that are sequentially distributed in a direction away from the black matrix, wherein an orthographic projection of the active layer on the base substrate is within an orthographic projection of the color filter layer on the base substrate, and the source-drain electrode layer comprises a source electrode and a drain electrode; the optical detection unit is electrically connected to the drain electrode; the auxiliary connection trace, the source electrode, and the drain electrode are distributed in the same layer; the optical detection unit is a photodiode, and a photosensitive surface of the optical detection unit is a surface of the optical detection unit away from the black matrix Optionally, the display panel further comprises a display back plate facing the display substrate; wherein the display back plate comprises: a light emitting unit and a driving unit, wherein the light emitting unit is electrically connected to the driving unit, and an orthographic projection of the optical detection unit on the base substrate is within an orthographic projection of the light emitting unit on the base substrate.

Optionally, the light emitting unit comprises an anode, a light emitting layer, and a cathode that are stacked sequentially, wherein the cathode is in contact with the second auxiliary cathode.

In still yet another aspect, there is provided a display device, comprising the display panel in any one of the above aspects.

DETAILED DESCRIPTION

The embodiments of the present disclosure will be described in further detail with reference to the accompanying drawings, to present the objects, technical solutions, and advantages of the present disclosure more clearly.

In an OLED display panel, a sub-pixel unit includes a light emitting unit and a driving unit. The light emitting unit includes an organic light emitting layer. The organic light emitting layer may deteriorate during the operating process of the OLED display panel, and the organic light emitting layers in different light emitting units may deteriorate at different speed. Thus, the light emitting luminance of different light emitting units may decline at different degrees, which may cause the problem of non-uniform illumination of the OLED display panel. Therefore, luminance compensation is needed for the OLED display panel.

As known to the inventors, the method for compensating luminance of the OLED display panel includes an external compensating method and an internal compensating method. The external compensating method refers to compensating luminance of each light emitting unit in the OLED display panel by means of professional equipment before the OLED display panel is delivered from the factory. However, after the OLED display panel is delivered from the factory, luminance of the light emitting unit cannot be compensated by the external compensating method. The internal compensating method refers to providing in each sub-pixel region of the OLED display panel an optical detection unit and a thin film transistor (TFT) and providing outside the OLED display panel an optical compensating integrated circuit (IC) that is electrically connected to the TFT. The optical detection unit may detect the light emitting luminance of the light emitting unit, convert the light emitting luminance to a leakage current of the TFT, and then transmit the leakage current to the optical compensating IC through the TFT, to enable the optical compensating IC to compensate luminance of the light emitting unit. The internal compensating method can compensate the luminance of the light emitting unit in real time, Even if the OLED display panel is delivered from the factory, the internal compensating method can still be adopted to compensate luminance of the light emitting unit. However, when the internal compensating method is adopted, a TFT and an optical detection unit need to be disposed in the sub-pixel region, which may cause the aperture ratio of the OLED display panel to become smaller, and therefore the display effect is affected.

Figure 1:
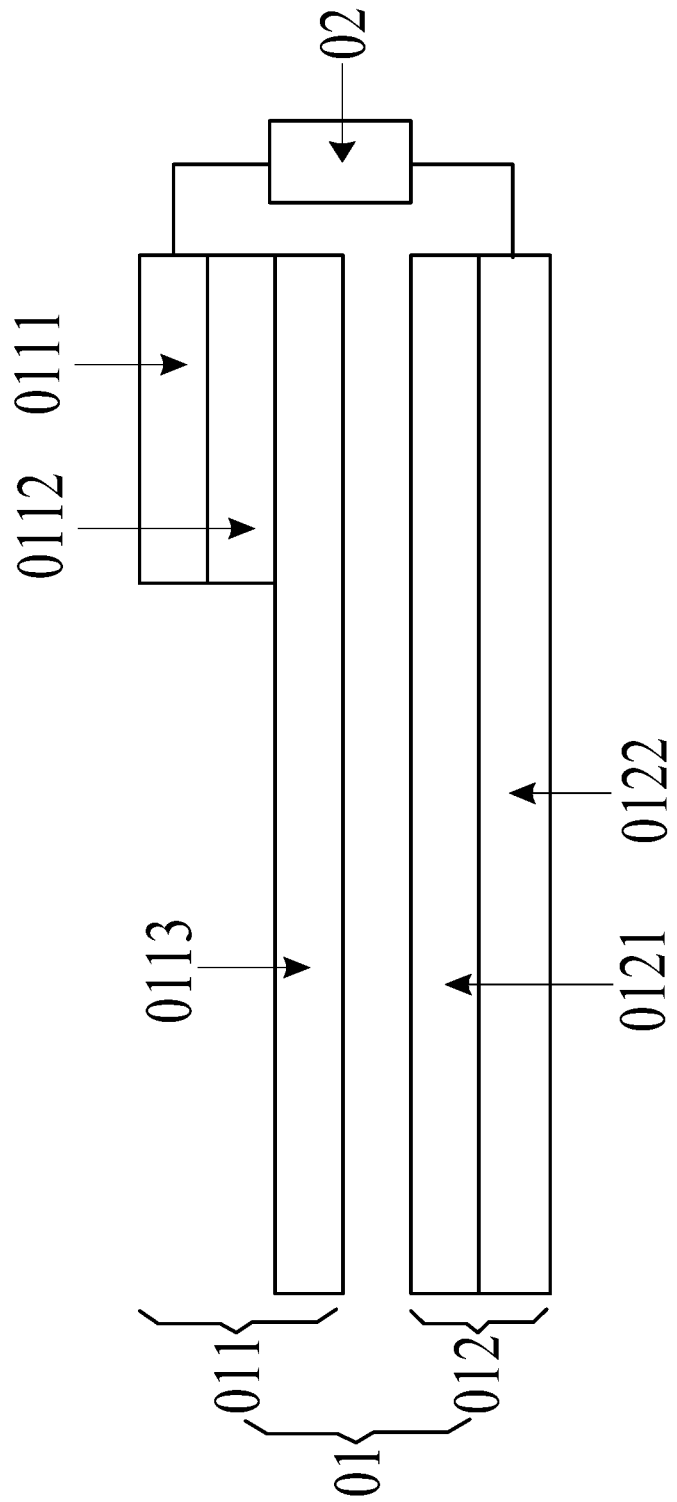
FIG. 1 is a schematic diagram of a sectional structure of an OLED display device according to an embodiment of the present disclosure.

Exemplarily, referring to FIG. 1, which is a schematic diagram of a sectional structure of an OLED display device in embodiments of the present disclosure, the OLED display device includes an OLED display panel 01 and an optical compensating IC 02 outside the OLED display panel 01. The OLED display panel 01 includes a display cover plate 011 and a display back plate 012 facing each other. The display cover plate 011 and the display back plate 012 both have a plurality of sub-pixel regions (not marked in FIG. 1), and the sub-pixel regions of the display cover plate 011 are in a one-to-one correspondence with the sub-pixel regions of the display back plate 012. In the display cover plate 011, each sub-pixel region has a TFT 0111 and an optical detection unit 0112. The TFT 0111 is electrically connected to the optical detection unit 0112 and the optical compensating IC 02, respectively. In the display back plate 02, each sub-pixel region has a sub-pixel unit (not marked in FIG. 1), and the sub-pixel unit includes a light emitting unit 0121 and a driving unit 0112. The driving unit 0112 is electrically connected to the light emitting unit 0121 and the optical compensating IC 02, respectively. Under the driving of the driving unit 0122, the light emitting unit 0121 may laterally emit light toward the display cover 01. The optical detection unit 0112 can detect the light emitting luminance of the light emitting unit 0121 (that is, the luminance of light emitted from the light emitting unit 0121) and transmit the detected light emitting luminance to the optical compensating IC 02 through the TFT 0111 in a form of current. The optical compensating IC 02 may control the driving unit 0122 according to the light emitting luminance detected by the optical detection unit 0112, to adjust the light emitting luminance of the light emitting unit 0121, thereby compensating the light emitting luminance of the light emitting unit 0121.

Figure 2:
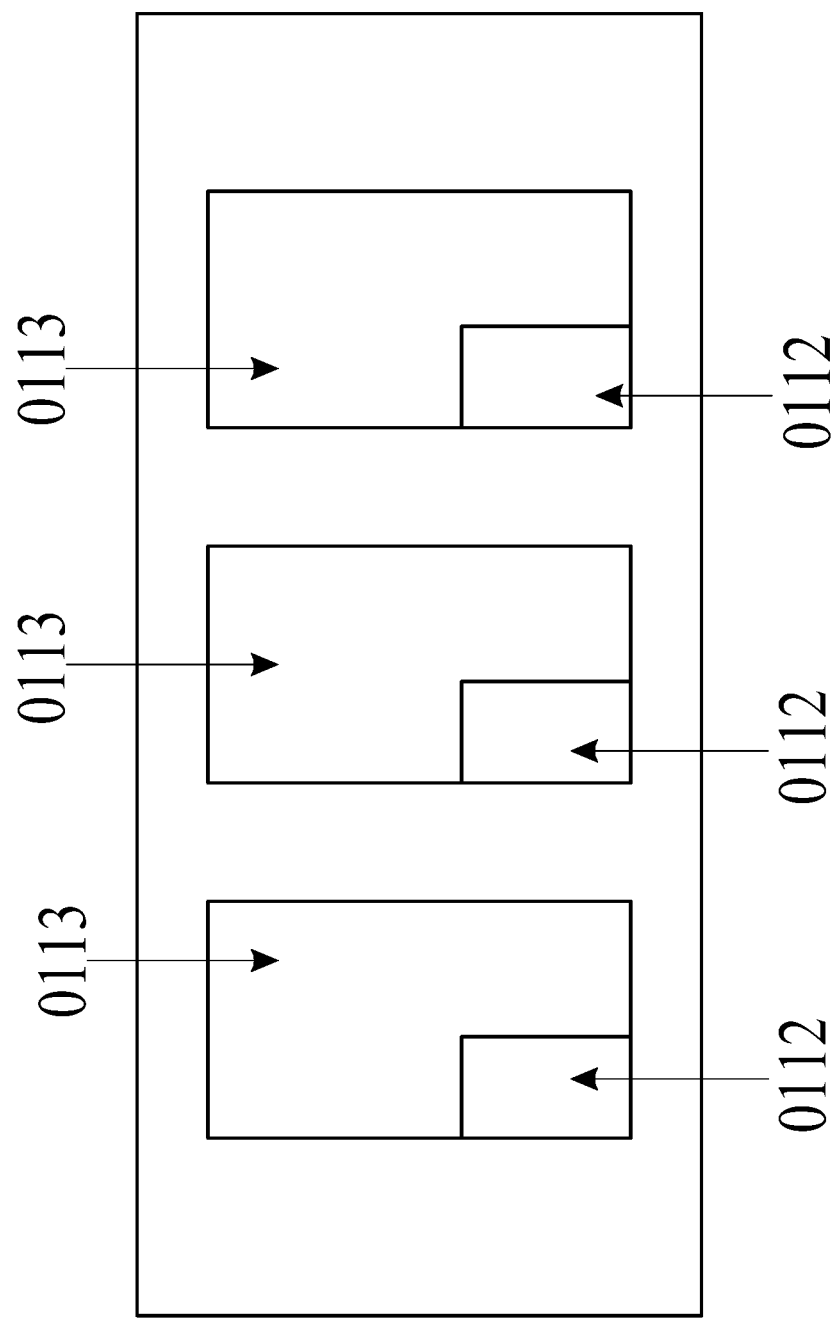
FIG. 2 is a schematic diagram of a top-view structure of the OLED display panel shown in FIG. 1.

Optionally, the display cover plate 01 further includes a color filter layer 0113. An orthographic projection of the color filter layer 0113 on the display back plate 012 covers the light emitting unit 0121. Light emitted from the light emitting unit 0121 irradiates to the optical detection unit 012 after passing through the color filter layer 0113. Please refer to FIG. 2, which is a top view of the structure of the OLED display panel shown in FIG. 1, an orthographic projection of the optical detection unit 0112 on the color filter layer 0113 is within the color filter layer 0113.

In the above OLED display device, in one aspect, as the optical detection unit 0112 needs to be electrically connected to the TFT 0111, among the light emitted from the light emitting unit 0121 and passing through the color filter layer 0113, the light passing through the optical detection unit 0112 and irradiating to the TFT 0111 may be shielded by the TFT 0111, and thereby cannot pass through the TFT 0111. Therefore, among the light emitted from the light emitting unit 0121 and passing through the color filter layer 0113, the light irradiating to the region where the optical detection unit 0112 is cannot be emitted from the OLED display panel 01, which causes the aperture ratio of the OLED display panel to be small, and thereby affects the display effect. In another aspect, the light emitting luminance detected by the optical detection unit 0112 is the luminance of the light emitted from the light emitting unit 0121 and passing through the color filter layer 0113. As the luminance of the light passing through the color filter layer 0113 may be decrease, the light emitting luminance detected by the optical detection unit 0112 is lower than the actual light emitting luminance of the light emitting unit 0121, which causes the luminance compensation performed to the light emitting unit according to the light emitting luminance detected by the optical detection unit 0112 to have a low accuracy. Thus, the display effect of the OLED display panel is poor.

Figure 3:
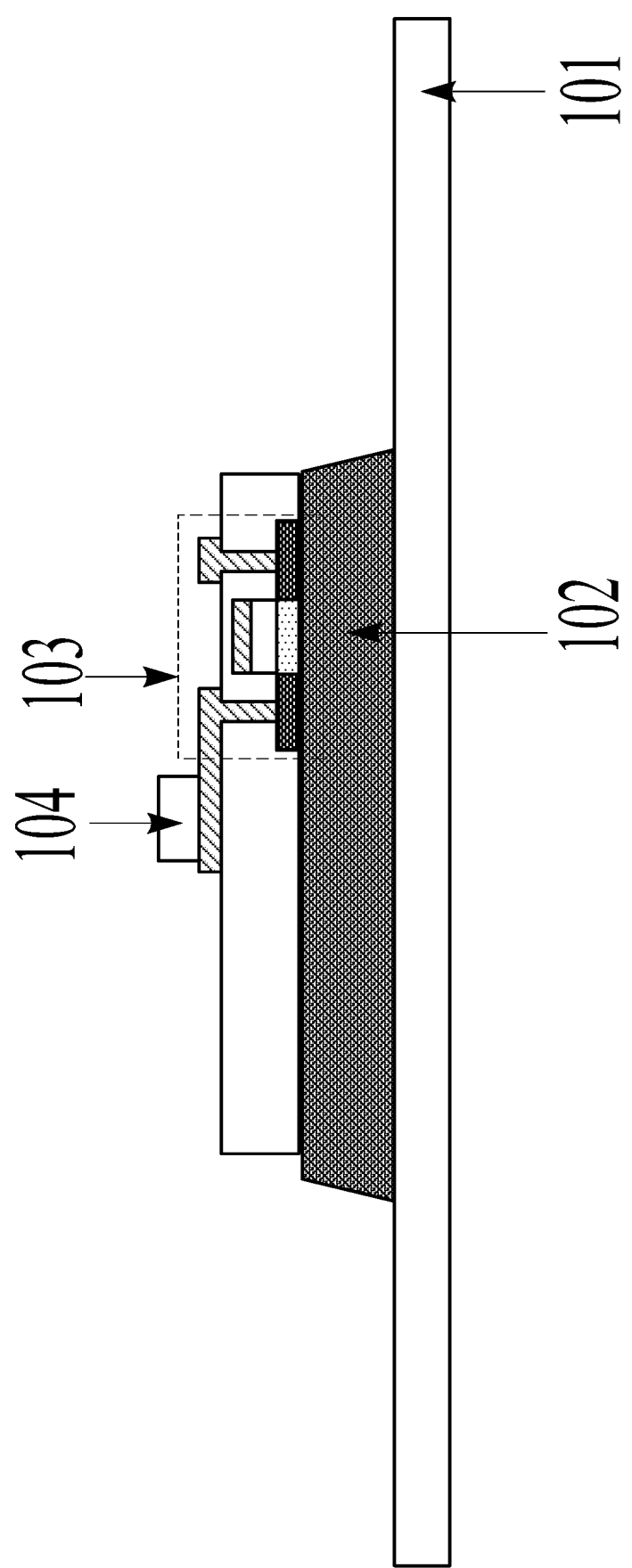
FIG. 3 is a schematic diagram of a sectional structure of a display substrate according to an embodiment of the present disclosure.

Please refer to FIG. 3, which is a schematic diagram of a sectional structure of a display substrate according to the embodiments of the present disclosure, the display substrate includes: a base substrate 101, a black matrix 102 on the base substrate 101, and a switching unit 103 and an optical detection unit 104 at the side of the black matrix 102 away from the base substrate 101. The optical detection unit 104 is electrically connected to the switching unit 103, and the orthographic projection of at least one of the switching unit 103 and the optical detection unit 104 on the base substrate 101 is within the orthographic projection of the black matrix 102 on the base substrate 101.

In summary, in the display substrate provided in the embodiments of the present disclosure, the switching unit and the optical detection unit are at the side of the black matrix away from the base substrate, and the orthographic projection of at least one of the switching unit and the optical detection unit on the base substrate is within the orthographic projection of the black matrix on the base substrate, which helps reduce the influence on the aperture ratio of the display substrate caused by the switching unit and the optical detection unit, thereby increasing the aperture ratio of the display substrate.

Optionally, the orthographic projection of the switching unit 103 on the base substrate 101 and the orthographic projection of the optical detection unit 104 on the base substrate 101 are both within the orthographic projection of the black matrix 102 on the base substrate 101. In this way, the influence on the aperture ratio of the display substrate caused by the switching unit 103 and the optical detection unit 104 may be reduced to the greatest extent, thereby increasing the aperture ratio of the display substrate.

Figure 4:
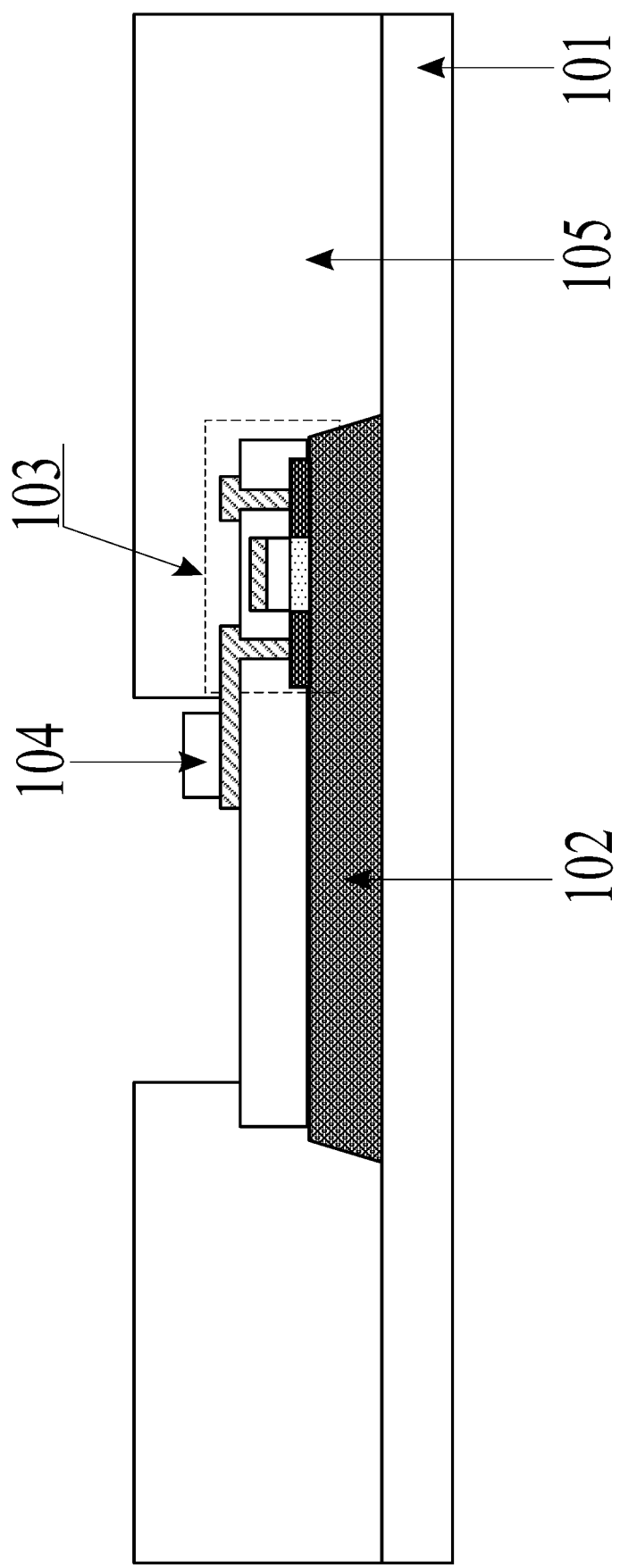
FIG. 4 is a schematic diagram of a sectional structure of another display substrate according to an embodiment of the present disclosure.

Optionally, please refer to FIG. 4, which that is a schematic diagram of a sectional structure of another display substrate according to the embodiments of the present disclosure, on the basis of FIG. 3, the display substrate further includes a color filter layer 105 at the side of the switching unit 103 away from the black matrix 102. The orthographic projection of the color filter layer 105 on the base substrate 101 is staggered from the orthographic projection of the optical detection unit 104 on the base substrate 101. In this way, the color filter layer 105 may be prevented from shielding the optical detection unit 104, and light emitted from the light emitting unit can irradiate to the optical detection unit 104 without passing through the color filter layer 105, such that the light emitting luminance detected by the optical detection unit 104 is closer to the actual light emitting luminance of the light emitting unit.

Figure 5:
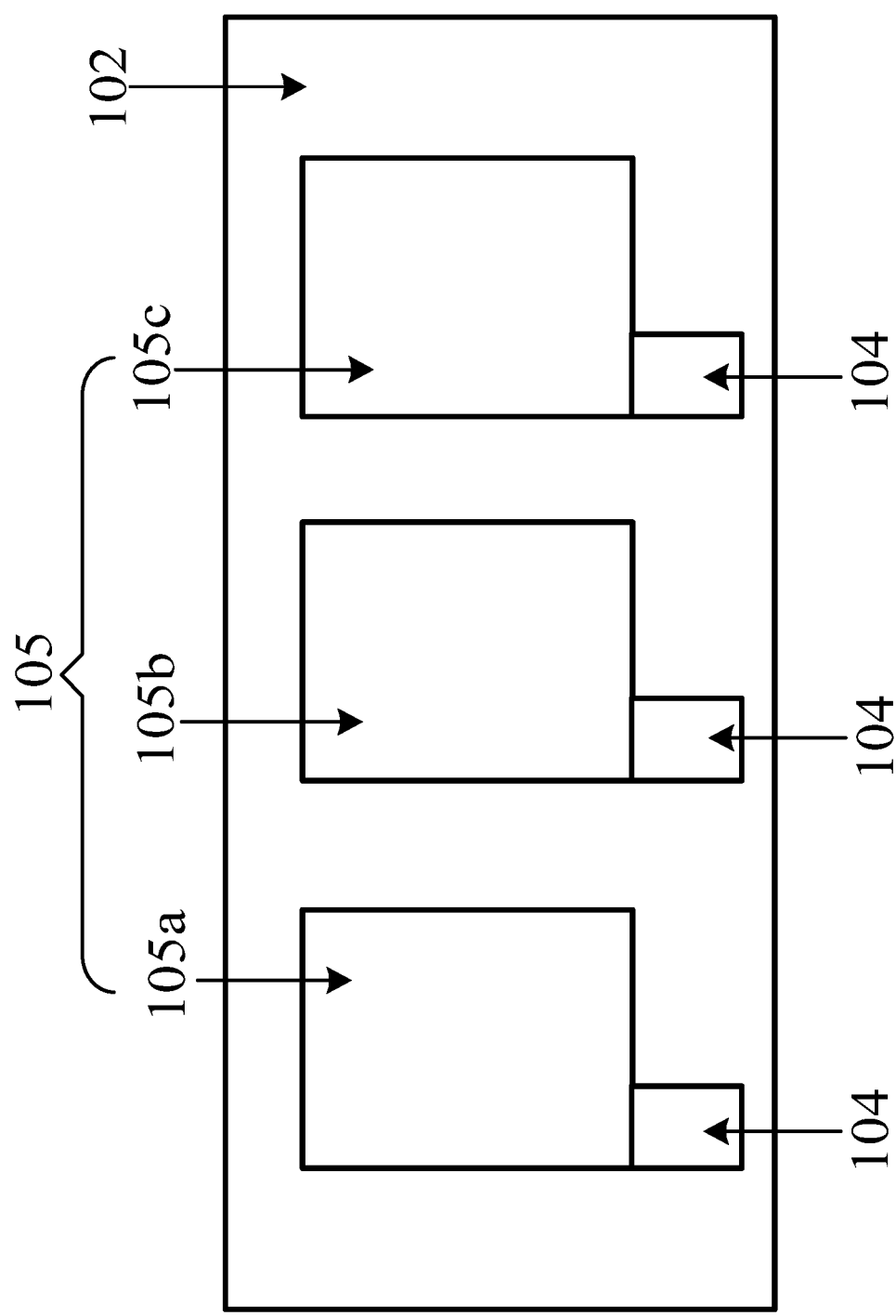
FIG. 5 is a schematic diagram of a top-view structure of the display substrate shown in FIG. 4.

Optionally, the black matrix 102 defines on the base substrate 101 a plurality of sub-pixel regions that are arranged in an array (neither marked in FIG. 3 nor FIG. 4). Referring to FIG. 5, which is a schematic diagram of a top-view structure of the display substrate shown in FIG. 4, the color filter layer 105 includes a plurality of filter blocks correspondingly disposed in the plurality of sub-pixel regions (not marked in FIG. 5) one by one. That is, each sub-pixel region has a filter block. Exemplarily, in the plurality of sub-pixel regions, every three sub-pixel regions may constitute one pixel region, and each pixel region may include a red sub-pixel region, a green sub-pixel region, and a blue sub-pixel region. The red sub-pixel region has a red filter block 105a, the green sub-pixel region has a green filter block 105b, and the blue sub-pixel region has a blue filter block 105c.

In the embodiments of the present disclosure, the display substrate has a plurality of sub-pixel regions, and each sub-pixel region has a switching unit 103 and an optical detection unit 104. Each optical detection unit 104 is configured to detect the light emitting luminance in the sub-pixel region where the optical detection unit 104 is (that is, the light emitting luminance of the light emitting unit in the sub-pixel region), and the light emitting luminance detected by each optical detection unit 104 is transmitted out of the display substrate through the connected switching unit 103 in the form of current.

Figure 6:
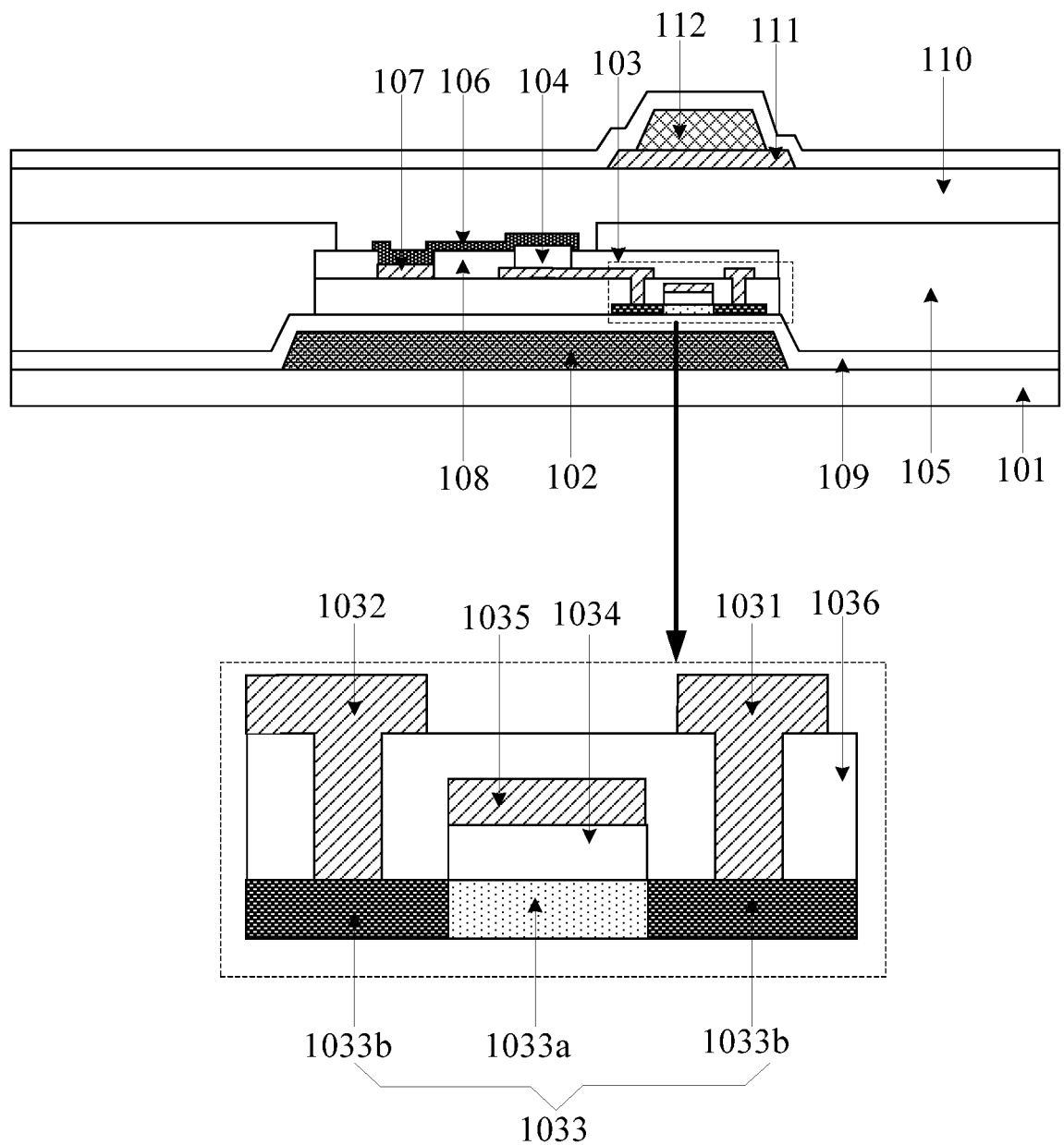
FIG. 6 is a schematic diagram of a sectional structure of yet another display substrate according to an embodiment of the present disclosure.
Figure 7:
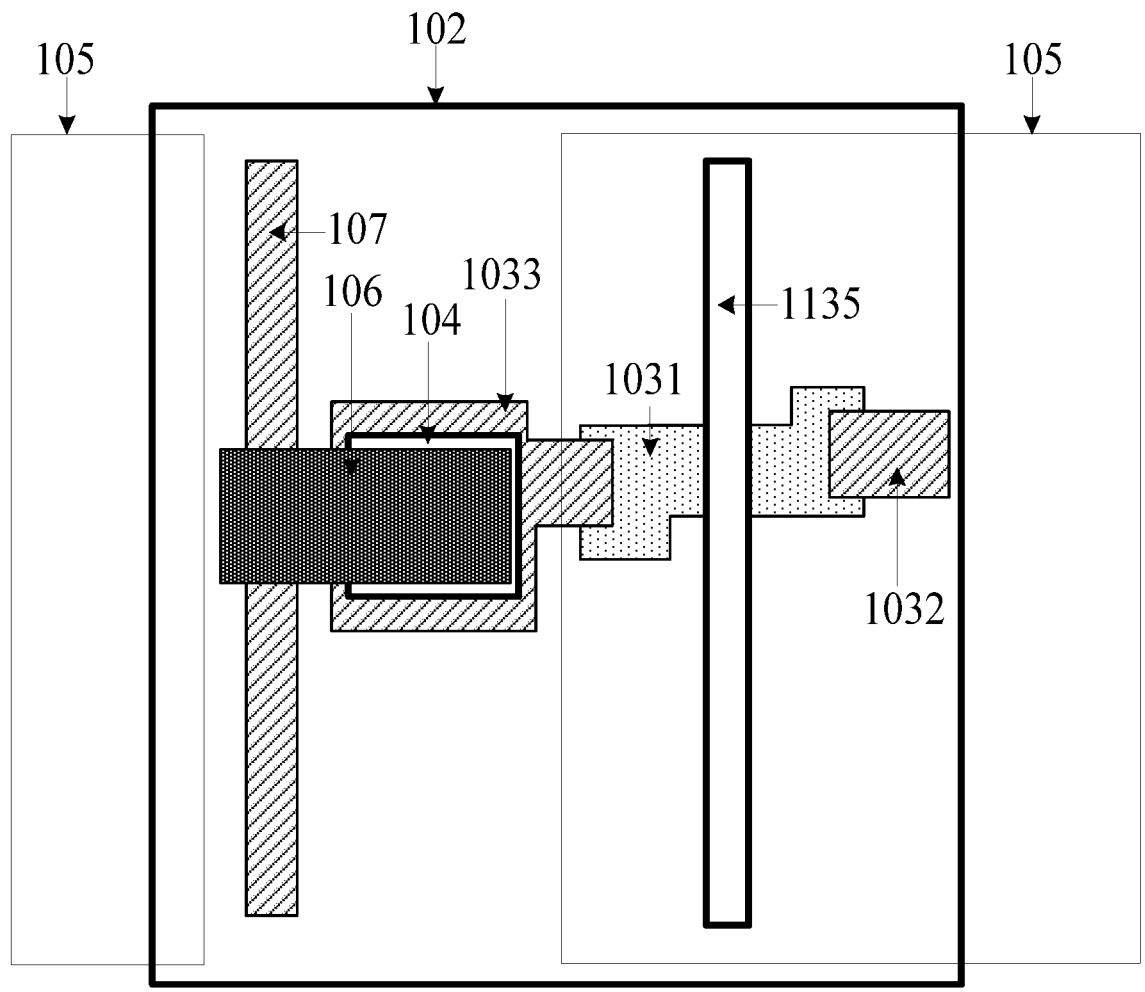
FIG. 7 is a schematic diagram of a top-view structure of the display substrate shown in FIG. 6.

Please refer to FIG. 6 and FIG. 7. FIG. 6 is a schematic diagram of a sectional structure of yet another display substrate according to an embodiment of the present disclosure and FIG. 7 is a schematic diagram of a top-view structure of the display substrate shown in FIG. 6. FIG. 6 and FIG. 7 merely show the switching unit 103 and the optical detection unit 104 corresponding to a sub-pixel region. The orthographic projection of the optical detection unit 104 on the base substrate 101 is within the orthographic projection of the black matrix 102 on the base substrate 101. The black matrix 102 may shield ambient light, which helps prevent the ambient light from passing through the base substrate 101 to irradiate to the optical detection unit 104, such that the light irradiated to the optical detection unit 104 may merely be the light in the sub-pixel region. Thus, the light emitting luminance detected by the optical detection unit 104 may be closer to the actual light emitting luminance in the sub-pixel region, and thereby the light emitting luminance detected by the optical detection unit 104 may have a high accuracy.

Optionally, as shown in FIG. 6, the switching unit 103 includes a first electrode 1031 and a second electrode 1032. The optical detection unit 104 is electrically connected to one of the first electrode 1031 and the second electrode 1032, which enables the optical detection unit 104 to be electrically connected to the switching unit 103. For example, the optical detection unit 104 is electrically connected to the second electrode 1032. The first electrode 1031 and second electrode 1032 may both be made from a metal material, such as, Mg (magnesium), Ag (silver), Mo (molybdenum), Cu (copper), Al (aluminum), Au (gold), and an alloy material thereof. The embodiment of the present disclosure is illustrated by taking an example in which the optical detection unit 104 is electrically connected to the second electrode 1032. In practice, the optical detection unit 104 may also be electrically connected to the first electrode 1031, which is not limited in the embodiments of the present disclosure.

Optionally, as shown in FIG. 6, the switching unit 3 further includes an active layer 1033, and the orthographic projection of the active layer 1033 on the base substrate 101 is within the orthographic projection of the color filter layer 105 on the base substrate 101. The color filter layer 105 may shield the active layer 1033, to reduce the light irradiating to the active layer 1033 in the sub-pixel region, thereby avoiding threshold drift for the switching unit 103. In addition, the orthographic projection of the active layer 1033 on the base substrate 101 is within the orthographic projection of the black matrix 102 on the base substrate 101. The black matrix 102 may also shield the active layer 1033, which helps prevent the ambient light from passing through the base substrate 101 to irradiate to the active layer 1033, thereby avoiding threshold drift phenomenon for the switching unit 103. Since the black matrix 102 may shield the active layer 1033, there is no need to provide a light shielding layer to shield the active layer 1033, which simplifies the structure of the display substrate. In the embodiments of the present disclosure, the color filter layer 105 and the black matrix 102 may shield the active layer 1033 from two sides of the active layer 1033, which helps reduce the light irradiating to the active layer 1033, and thereby avoiding threshold drift for the switching unit 103. Thus, the switching unit 103 has a good switching characteristic.

Optionally, the switching unit 103 may be a TFT, which includes an active layer 1033, a gate insulating layer 1034, a gate electrode 1035, an interlayer dielectric layer 1036, and a source-drain electrode layer that are sequentially distributed in a direction away from the black matrix 102. The source-drain electrode layer includes a source electrode and a drain electrode. The first electrode 1031 is the source electrode, the second electrode 1032 is the drain electrode. The optical detection unit 104 is electrically connected to the drain electrode. As shown in FIG. 6, the active layer 1033 may include a channel region 1033a and doped regions 1033b disposed at two sides of the channel region 1033a. The doped regions 1033b may be lightly doped regions, and have higher conductivity than the channel region 1033a. The interlayer dielectric layer 1036 has therein a source electrode via-hole (not marked in FIG. 6) and a drain electrode via-hole (not marked in FIG. 6). The first electrode 1031 is in contact with one doped region 1033b through the source electrode via-hole, and the second electrode 1032 is in contact with the other doped region 1033b through the drain electrode via-hole. In the embodiments of the present disclosure, the switching unit 103 is a top gate TFT that has a self-aligned structure. A person skilled in the art shall understand that the switching unit 103 shown in FIG. 6 is merely illustrative, and the switching unit may also be a bottom gate TFT, such as an etch stop layer (ESL) type TFT or a back channel etch (BCE) type TFT, which is not limited in the embodiments of the present disclosure.

Optionally, the optical detection unit 104 may be a photodiode, and the photosensitive surface of the optical detection unit 104 is the surface of the optical detection unit 104 away from the black matrix. When the optical detection unit 104 is a photodiode, the optical detection unit 104 may include a first electrode, a photosensitive layer, and a second electrode (neither shown in FIG. 6 nor FIG. 7) that are laminated sequentially. The photosensitive layer may be a PIN layer, and the first electrode may be close to or away from the black matrix 102 with respect to the second electrode. The electrode, away from the black matrix 102, of the first electrode and the second electrode may be a transparent electrode, such that the photosensitive surface of the optical detection unit 104 is the surface of the optical detection unit 104 away from the black matrix. The transparent electrode may be an indium tin oxide (ITO) electrode, an indium zinc oxide (IZO) electrode, an aluminum-doped zinc oxide (AZO) electrode or an aluminum-doped zinc oxide tin (AZTO) electrode, etc. The photosensitive layer may include a P-type semiconductor layer, an intrinsic semiconductor layer, and an N-type semiconductor layer that are laminated sequentially. The P-type semiconductor layer may be close to or away from the first electrode with respect to the N-type semiconductor layer. In addition, the P-type semiconductor layer may be a P-type doped amorphous silicon (a-Si) film layer, such as, a boron-doped a-Si film layer. The intrinsic semiconductor layer may be an a-Si film layer, and the N-type semiconductor layer may be an N-type doped a-Si film layer, such as a phosphorus-doped a-Si film layer or an arsenic-doped a-Si film layer, which is not limited in the embodiments of the present disclosure Optionally, as shown in FIG. 6, the display substrate further includes a primary connection trace 106 at the side of the optical detection unit 104 away from the black matrix 102, and an auxiliary connection trace 107 electrically connected to the primary connection trace 106. The primary connection trace 106 is electrically connected to the optical detection unit 104, and configured to apply an operating voltage to the optical detection unit 104. The operating voltage may be a reverse voltage that enables reversal of biasing of the optical detection unit 104, and the primary connection trace 106 may be connected to a voltage-applying unit (neither shown in FIG. 6 nor FIG. 7) that applies an operating voltage to the optical detection unit 104. The voltage-applying unit may be outside the display substrate. The auxiliary connecting trace 107 is configured to reduce the resistance of the primary connecting trace 106. As shown in FIG. 6, the primary connection trace 106 and the auxiliary connection trace 107 are distributed in different layers, and the auxiliary connection trace 107 may be connected in parallel with the primary connection trace 106, to reduce the resistance of the primary connection trace 106. The material of the primary connecting trace 106 may be a transparent conductive material, such as one or a combination of ITO, IZO, AZO and AZTO. In this way, the primary connection trace 106 may be prevented from affecting the accuracy of the luminance detection performed by the optical detection unit 104. The material of the auxiliary connection trace 107 may be a metal material. The metal material has a small resistance. Thus, the auxiliary connection trace 107 may reduce the resistance of the primary connection trace 106.

Optionally, as shown in FIG. 6, the auxiliary connection trace 107, the first electrode 1031 and the second electrode 1032 are distributed in the same layer, and can be prepared by a once patterning process to simplify the manufacturing process of the display substrate.

Optionally, as shown in FIG. 6, the switching unit 103 and the optical detection unit 104 are distributed in a direction away from the black matrix 102. The display substrate further includes a passivation layer 108 at a side of the switching unit 103 away from the black matrix 102, and the passivation layer 108 has a via-hole (not marked in FIG. 6). At least part of the optical detection unit 104 is in the via-hole. The passivation layer 108 may be an insulating layer, and may insulate the primary connection trace 106, the first electrode 1031, and the second electrode 1032 from each other, which helps prevent short circuit between the primary connection trace 106 and the first electrode 1031 as well as the second electrode 1032. As shown in FIG. 6, the auxiliary connection trace 107 is electrically connected to the primary connection trace 106 through the via-hole (not marked in FIG. 6) in the passivation layer 108.

Optionally, as shown in FIG. 6, the display substrate further includes an insulating layer 109 between the black matrix 102 and the switching unit 103. The black matrix has a large amount of carbon elements and carbon elements have certain conductivity. Therefore, the switching unit is easily short-circuited by the black matrix. The insulating layer 109 may insulate the black matrix 102 from the switching unit 103, which helps prevent the switching unit 103 from being short-circuited by the black matrix 102.

Optionally, the display substrate further includes a protective layer 110, a first auxiliary cathode 111, a supporting column 112, and a second auxiliary cathode 113 that are disposed at a side of the color filter layer 105 away from the base substrate 101. The protective layer 110, the first auxiliary cathode 111, the supporting column 112, and the second auxiliary cathode 113 are distributed in a direction away from the base substrate 101, and the first auxiliary cathode 111 is electrically connected to the second auxiliary cathode 113. The material of the protective layer 110 may be one or a combination of silicon oxide, silicon nitride and silicon oxynitride. The material of the supporting column 112 may be resin. The material of the first auxiliary cathode 111 may be a metal material, such as metal Mo, metal Al, metal Au, metal Cu, metal Hf (tantalum), metal Ta (tantalum) or metal Ti (titanium), or may be an alloy material, such as MoNb (molybdenum-niobium) alloy or AlNd (aluminum-niobium) alloy. The first auxiliary cathode 111 may be a one-layer or multi-layer structure. For example, the first auxiliary cathode 111 is a multi-layer structure formed by a MoNb alloy layer, a metal Cu layer, and a MoNb alloy layer. Alternatively, the first auxiliary cathode 111 is a multi-layer structure formed by an AlNd alloy layer, a metal Mo layer, and an AlNd alloy layer. The material of the second auxiliary cathode 113 is a transparent conductive material, such as one or a combination of IZO, AZO and AZTO. The first auxiliary cathode 111 is configured to reduce the resistance of the second auxiliary cathode 113. The embodiments of the present disclosure is illustrated by taking an example in which the first auxiliary cathode 111, the supporting column 112 and the second auxiliary cathode 113 are distributed in a direction away from the base substrate 101. In another optional implementation, it may be that the supporting column, the first auxiliary cathode and the second auxiliary cathode are distributed in a direction away from the base substrate, which is not limited in the embodiments of the present disclosure.

In the embodiments of the present disclosure, the optical detection unit 104 is disposed on the black matrix 102, and the orthographic projection of the color filter layer 105 on the base substrate 101 is staggered from the orthographic projection of the optical detection unit 104 on the base substrate 101. Therefore, light passing through the color filter layer 105 may be emitted out of the display substrate without the need to irradiating to the region where the color filter layer 105 is, so that the display substrate has a high aperture ratio and thereby has a good display effect. Furthermore, since the orthographic projection of the color filter layer 105 on the base substrate 101 is staggered from the orthographic projection of the optical detection unit 104 on the base substrate 101, light in each sub-pixel region may irradiate to the optical detection unit 104 without the need to pass through the color filter layer 105. Thus, the light emitting luminance detected by the optical detection unit 104 is closer to the actual light emitting luminance of the sub-pixel region, and the accuracy of the light emitting luminance detected by the optical detection unit 104 is high, which helps improve the accuracy in compensating the luminance of the display substrate according to the light emitting luminance detected by the optical detection unit 104, thereby the display substrate has a good display effect.

It is easy to understand that the display substrates shown in FIGS. 3-7 are merely illustrative. Each optical detection unit 104 in the display substrate may be connected to the voltage-applying unit through the primary connection trace 106. The first electrode 1031 of each switching unit 103 may be connected to the optical compensating IC. The voltage-applying unit and the optical compensating IC may both be disposed at the outside of the display substrate, and the voltage-applying unit may be a functional module in the optical compensating IC. The voltage-applying unit may apply an operating voltage to the optical detection unit 104. Under the action of the operating voltage, the optical detection unit 104 may generate a weak current. The current may be transmitted to the optical compensating IC through the switching unit 103. When light irradiates to the optical detection unit 104, photo-generated carriers may be generated by the optical detection unit 104, such that the current generated by the optical detection unit 104 increase greatly, and thereby the current transmitted to the optical compensating IC increases. It is easy to understand that when the luminance of the light irradiating to the optical detection unit 104 is different, concentrations of the photo-generated carriers generated by the optical detection unit 104 are different, and thereby the current transmitted to the optical compensating IC is also different. Thus, the optical compensating IC can determine the light emitting luminance according to the received current.

Optionally, the display substrate includes a plurality of sub-pixel regions, and each sub-pixel region includes a switching unit 103 and an optical detection unit 104. When the switching unit 103 is a TFT, the display substrate may further include a plurality of gate lines and a plurality of data lines. Each of the gate lines is connected to the gate electrodes of the switching units 103 in a row of sub-pixel regions, and each of the data lines is connected to the source electrodes (i.e., a first electrode 1031) of the switching units 103 in a column of sub-pixel regions. In addition, each of the data lines is also connected to the optical compensating IC at the outside of the display substrate. Thus, the optical compensating IC is connected to each switching unit 103 through the data lines. The plurality of gate lines may sequentially turn on the switching units 103 in rows of sub-pixel regions. After turning on the switching units 103 in each row of sub-pixel regions, the optical compensating IC may collect the current output by the optical detection units 104 in the row of sub-pixel regions through the plurality of data lines, and determine the light emitting luminance according to the current output by the respective optical detection units 104.

In summary, in the display substrate provided in the embodiments of the present disclosure, the switching unit and the optical detection unit are at the side of the black matrix away from the base substrate, and the orthographic projection of at least one of the switching unit and the optical detection unit on the base substrate is within the orthographic projection of the black matrix on the base substrate, which helps reduce the influence caused by the switching unit and the optical detection unit on the aperture ratio of the display substrate, thereby increasing the aperture ratio of the display substrate.

In addition, since the orthographic projection of the color filter layer on the base substrate is staggered from the orthographic projection of the optical detection unit on the base substrate, the color filter layer may be prevented from shielding the optical detection unit, so that the light emitted from the light emitting unit may irradiate to the optical detection unit without the need to pass through the color filter layer. Thus, the light emitting luminance detected by the optical detection unit is closer to the actual light emitting luminance of the light emitting unit. The accuracy of the luminance of the light detected by the optical detection unit is high, which helps improve the accuracy in compensating the luminance of the display substrate according to the luminance of the light detected by the optical detection unit, thereby improving the display effect of the display substrate.

Based on the same inventive concept, the embodiments of the present disclosure further provide a display panel. The display panel may include the display substrate as shown in FIG. 3, FIG. 4 or FIG. 6. Here, the structure of the display substrate may be made reference to the above-described embodiments, which is not repeated in the embodiments of the present disclosure.

Figure 8:
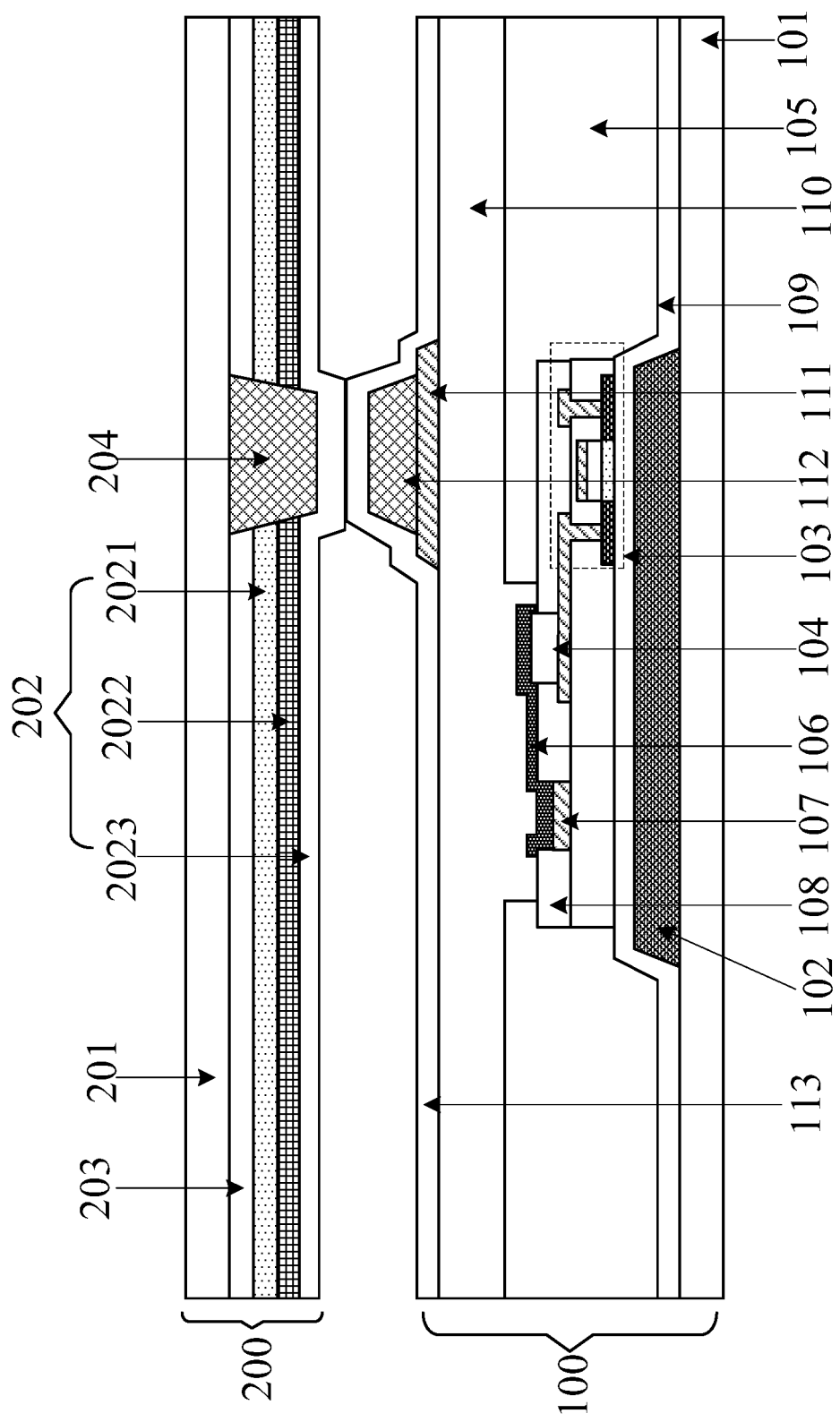
FIG. 8 is a schematic diagram of a structure of a display panel according to an embodiment of the present disclosure.

Optionally, as shown in FIG. 8, which is a schematic diagram of a sectional structure of a display panel according to an embodiment of the present disclosure, the display panel may include a display substrate 100 and a display back plate 200. The display substrate 100 may be the display substrate as shown in FIG. 3, FIG. 4 or FIG. 6. FIG. 8 is illustrated by taking an example in which the display substrate 100 is the display substrate shown in FIG. 6. The display substrate 100 and the display back plate 200 face each other. Alternatively, it may be understood as that the display substrate 100 is buckled on the display back plate 200, and the display substrate 100 may be a display back plate of the display back plate 200.

Optionally, the display back plate 200 may be a top-emitting display back plate. As shown in FIG. 8, the display back plate 200 may include a base substrate 201, and a light emitting unit 202 and a driving unit 203 on the base substrate 201. The light emitting unit 202 is electrically connected to the driving unit 203, and the light emitting unit 202 may laterally emit light toward the display substrate 100 under the drive of the driving unit 203. The orthographic projection of the optical detection unit 104 on the base substrate 101 is within the orthographic projection of the light emitting unit 202 on the base substrate 101. In this way, light emitted from the light emitting unit 202 can irradiate to the optical detection unit 104, which facilitates the optical detection unit 104 to detect the light emitting luminance of the light emitting unit 202.

Optionally, as shown in FIG. 8, the display back plate 200 further includes a pixel defining layer 204. The pixel defining layer 204 defines on the base substrate 201 a plurality of sub-pixel regions (not marked in FIG. 8) arranged in an array. Each sub-pixel region has a light emitting unit 202 and a driving unit 203. The sub-pixel regions of the display back plate 200 may be in one-to-one correspondence with the sub-pixel regions of the display substrate 100. The optical detection unit 104 in each sub-pixel region is configured to detect the light emitting luminance of the light emitting unit 202 in the corresponding sub-pixel region. It is easy to understand according to the above-described embodiments of the display substrate that the optical compensating IC may determine the luminance of the light irradiating to the optical detection unit 104 according to the current output from the optical detection unit 104. In the embodiments of the present disclosure, since the light irradiating to the optical detection unit 104 in each sub-pixel region is the light emitted from the light emitting unit 202 in the corresponding sub-pixel region, the luminance determined by the optical compensating IC according to the current output from the optical detection unit 104 is the light emitting luminance of light emitted from the corresponding light emitting unit 202.

Optionally, in the embodiments of the present disclosure, the optical compensating IC may be electrically connected to the driving unit 203 in each of the sub-pixel regions. For example, the optical compensating IC is electrically connected to the driving unit 203 in each sub-pixel region through a driving control IC of the display panel. After determining the luminance of the light emitted from the light emitting unit 202 in each sub-pixel region, the optical compensating IC may further judge whether the light emitting luminance meets the requirements. If not, the optical compensating IC may control the driving unit 203 in the sub-pixel region according to the light emitting luminance, to enable the driving unit 203 to drive the light emitting luminance of the light emitting unit 202 in the sub-pixel region to meet the requirements. Exemplarily, if the optical compensating IC determines that the light emitting luminance of the light emitting unit 202 in a sub-pixel region is low, the optical compensating IC may adjust the electrical signal input by the driving unit 203 in the sub-pixel region to the light emitting unit 202, to increase the light emitting luminance of the light emitting unit 202. If the optical compensating IC determines that the light emitting luminance of the light emitting unit 202 in a sub-pixel region is high, the optical compensating IC may adjust the electrical signal input by the driving unit 203 in the sub-pixel region to the light emitting unit 202, to decrease the light emitting luminance of the light emitting unit 202.

Optionally, in the embodiments of the present disclosure, the light emitting unit 202 may be an organic light emitting unit, such as an OLED unit or a quantum dot light emitting diode (QLED) unit. As shown in FIG. 8, the light emitting unit 202 may further include an anode 2021, a light emitting layer 2022, and a cathode 2023 that are sequentially distributed in a direction away from the base substrate 201. The light emitting layer 2022 may be an OLED light emitting layer or a QLED light emitting layer. The material of the anode 2021 may be a metal material with reflectivity, such as metal Ag, metal Mo, metal Cu, metal Al, metal Au, and an alloy material thereof. The material of the cathode 2023 may be a transparent conductive material, such as one or a combination of ITO, IZO, AZO and AZTO. As shown in FIG. 8, the cathode 2023 in the display back plate 200 abuts against the second auxiliary cathode 113 in the display substrate 100, so that the cathode 2023 is electrically connected to the second auxiliary cathode 113 and is further electrically connected to the first auxiliary cathode 111 through the second auxiliary cathode 113, to reduce the resistance of the cathode 2023 through the second auxiliary cathode 113 and the first auxiliary cathode 111.

Optionally, in the embodiments of the present disclosure, the driving unit 203 may be a TFT, including a gate electrode, a gate insulating layer, an active layer, a source electrode, and a drain electrode (not shown in FIG. 8). The source electrode and the drain electrode are in contact with the active layer, respectively, and the structure of the TFT may be made reference to the structure of the switching unit 103 in the above-described embodiments, which is not repeated in the embodiments of the present disclosure.

In summary, in the display substrate provided in the embodiments of the present disclosure, the switching unit and the optical detection unit are at the side of the black matrix away from the base substrate, and the orthographic projection of at least one of the switching unit and the optical detection unit on the base substrate is within the orthographic projection of the black matrix on the base substrate, which helps reduce the influence caused by the switching unit and the optical detection unit on the aperture ratio of the display panel, thereby increasing the aperture ratio of the display panel.

In addition, since the orthographic projection of the color filter layer on the base substrate is staggered from the orthographic projection of the optical detection unit on the base substrate, the color filter layer may be prevented from shielding the optical detection unit, so that light emitted from the light emitting unit may irradiate to the optical detection unit without the need to pass through the color filter layer. Thus, the light emitting luminance detected by the optical detection unit is closer to the actual light emitting luminance of the light emitting unit. The accuracy of the luminance of light detected by the optical detection unit is high, which helps improve the accuracy in compensating the luminance of the display substrate according to the luminance of the light detected by the optical detection unit, and thereby improve the display effect of the display panel.

Figure 9:
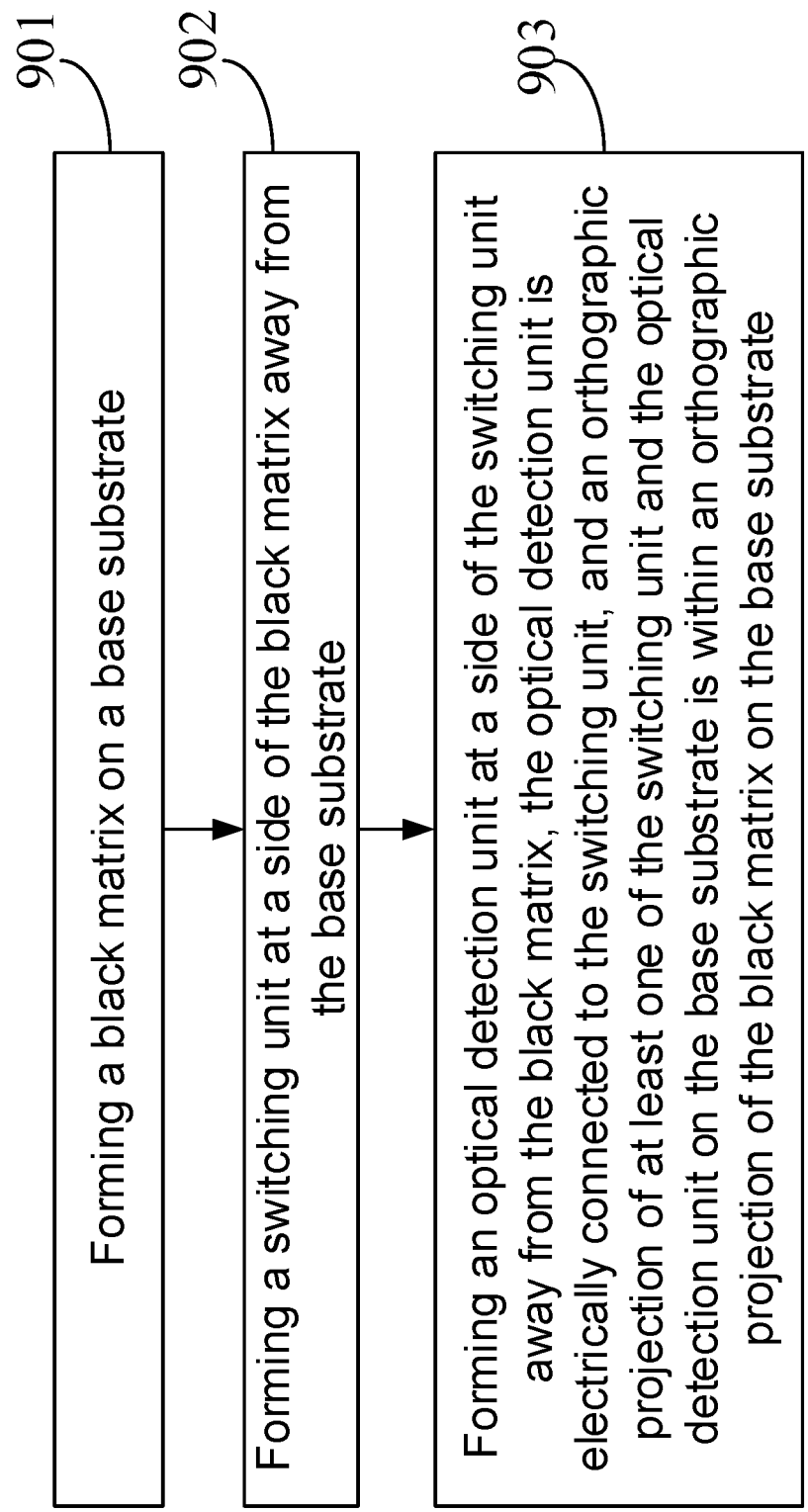
FIG. 9 is a flowchart of a method for manufacturing a display substrate according to an embodiment of the present disclosure.

Please refer to FIG. 9, which is a flowchart of a method for manufacturing a display substrate according to an embodiment of the present disclosure, the method is applied to manufacture the display substrate shown in FIG. 3, FIG. 4 or FIG. 6. The method may include following steps.

In step 901, a black matrix is formed on a base substrate.

In step 902, a switching unit is formed at a side of the black matrix away from the base substrate.

In step 903, an optical detection unit is formed at a side of the switching unit away from the black matrix. The optical detection unit is electrically connected to the switching unit, and an orthographic projection of at least one of the switching unit and the optical detection unit on the base substrate is within an orthographic projection of the black matrix on the base substrate.

In summary, according to the method for manufacturing the display substrate provided in the embodiments of the present disclosure, the switching unit and the optical detection unit at the side of the black matrix away from the base substrate, and the orthographic projection of at least one of the switching unit and the optical detection unit on the base substrate is within the orthographic projection of the black matrix on the base substrate, which helps reduce the influence caused by the switching unit and the optical detection unit on the aperture ratio of the display substrate, thereby increasing the aperture ratio of the display substrate.

Figure 10:
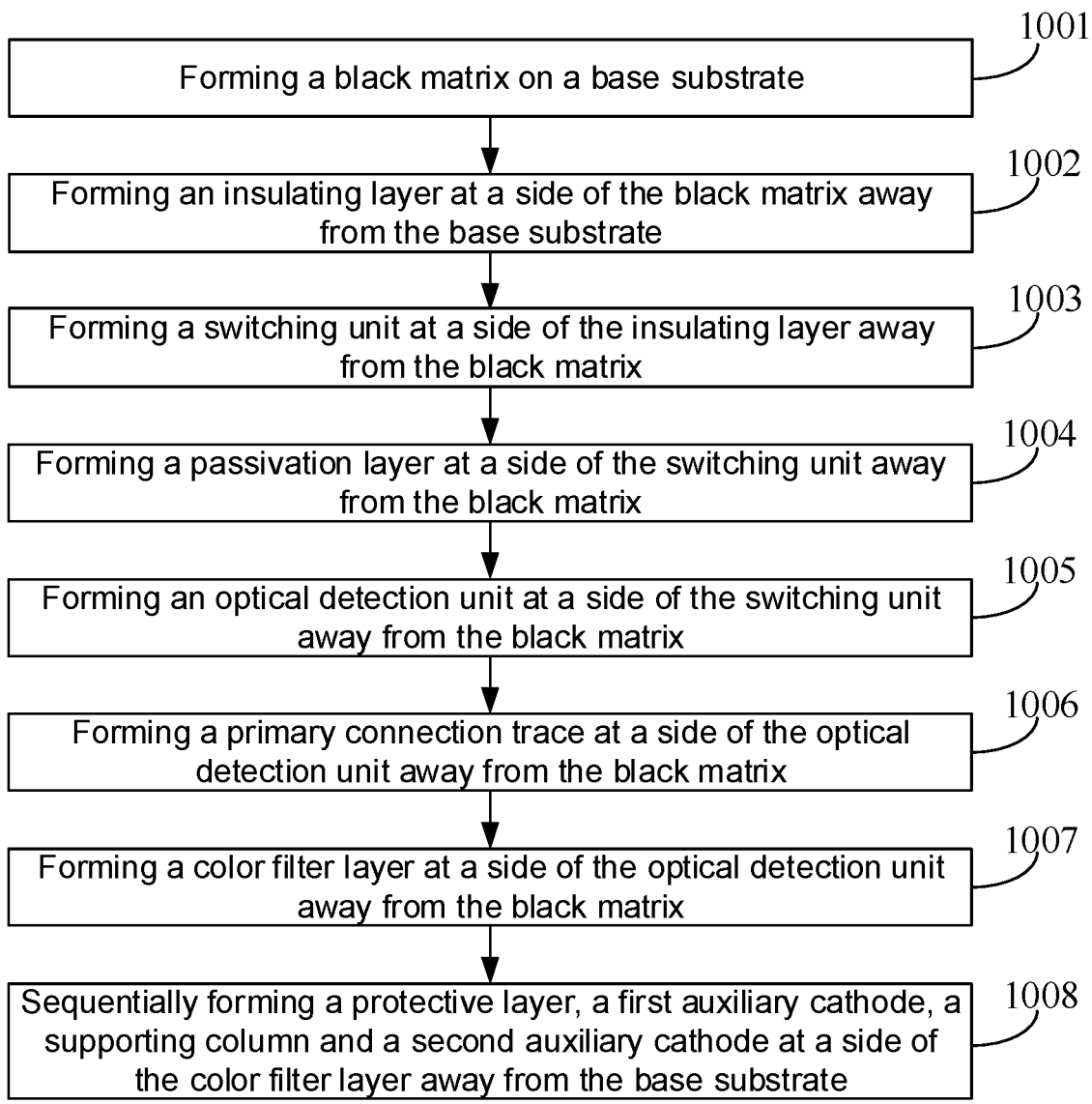
FIG. 10 is a flowchart of another method for manufacturing a display substrate according to an embodiment of the present disclosure.

Please refer to FIG. 10, which is a flowchart of another method for manufacturing a display substrate according to an embodiment of the present disclosure, the present embodiment is illustrated by taking manufacture of the display substrate shown in FIG. 6 as an example. The method may include following steps.

In step 1001, a black matrix is formed on a base substrate.

Optionally, the base substrate may be cleaned firstly, and then a black matrix is formed on the base substrate. The material of the black matrix may be a black insulating material, such as a black resin.

Figure 11:
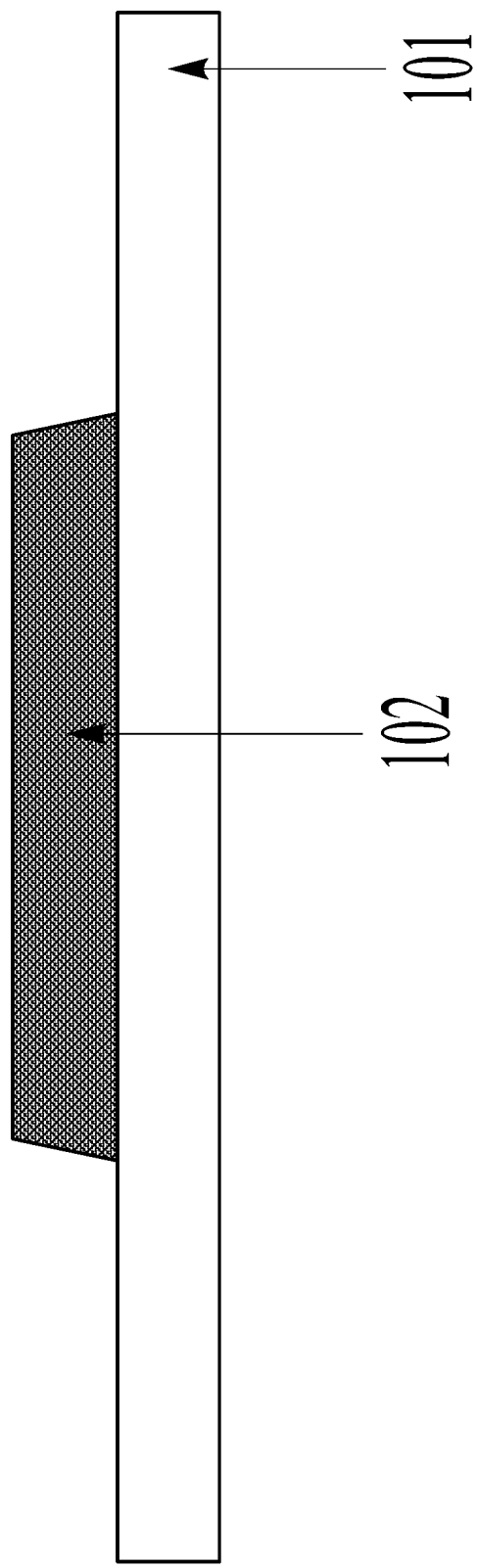
FIGS. 11-17 are flowcharts of a process for manufacturing a display substrate according to an embodiment of the present disclosure.

Please refer to FIG. 11. FIG. 11 is a schematic diagram after a black matrix 102 is formed on the base substrate 101 according to an embodiment of the present disclosure. Exemplarily, a black resin layer may be formed on the base substrate 101 by any one of deposition, coating, sputtering, or the like, and then the black resin layer is processed by a single patterning process to obtain the black matrix 102.

In step 1002, an insulating layer is formed at a side of the black matrix away from the base substrate.

Optionally, the material of the insulating layer may be one of or a combination of silicon oxide, silicon nitride and silicon oxynitride.

Figure 12:
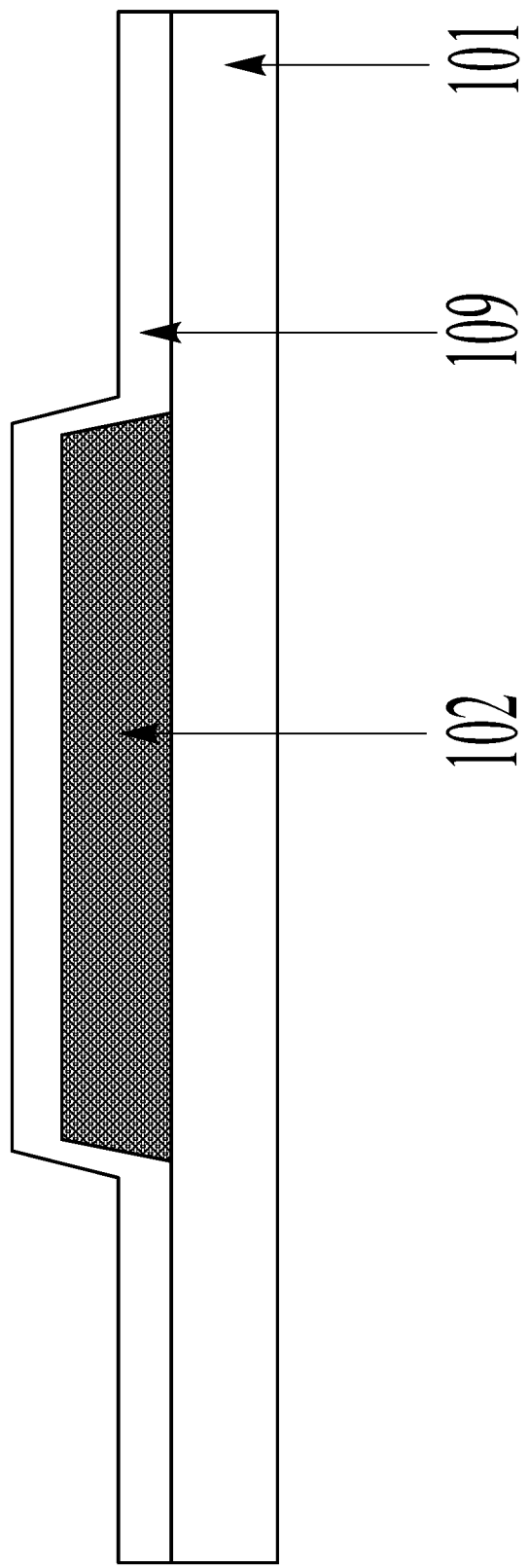

Exemplarily, referring to FIG. 12, which is a schematic diagram after the insulating layer 109 is formed at a side of the black matrix 102 away from the base substrate 101 according to an embodiment of the present disclosure, a layer of silicon oxide may be formed as the insulating layer 109 at a side of the black matrix 102 away from the base substrate 101 by any one of deposition, coating, sputtering, or the like.

In step 1003, a switching unit is formed at a side of the insulating layer away from the black matrix.

Figure 13:
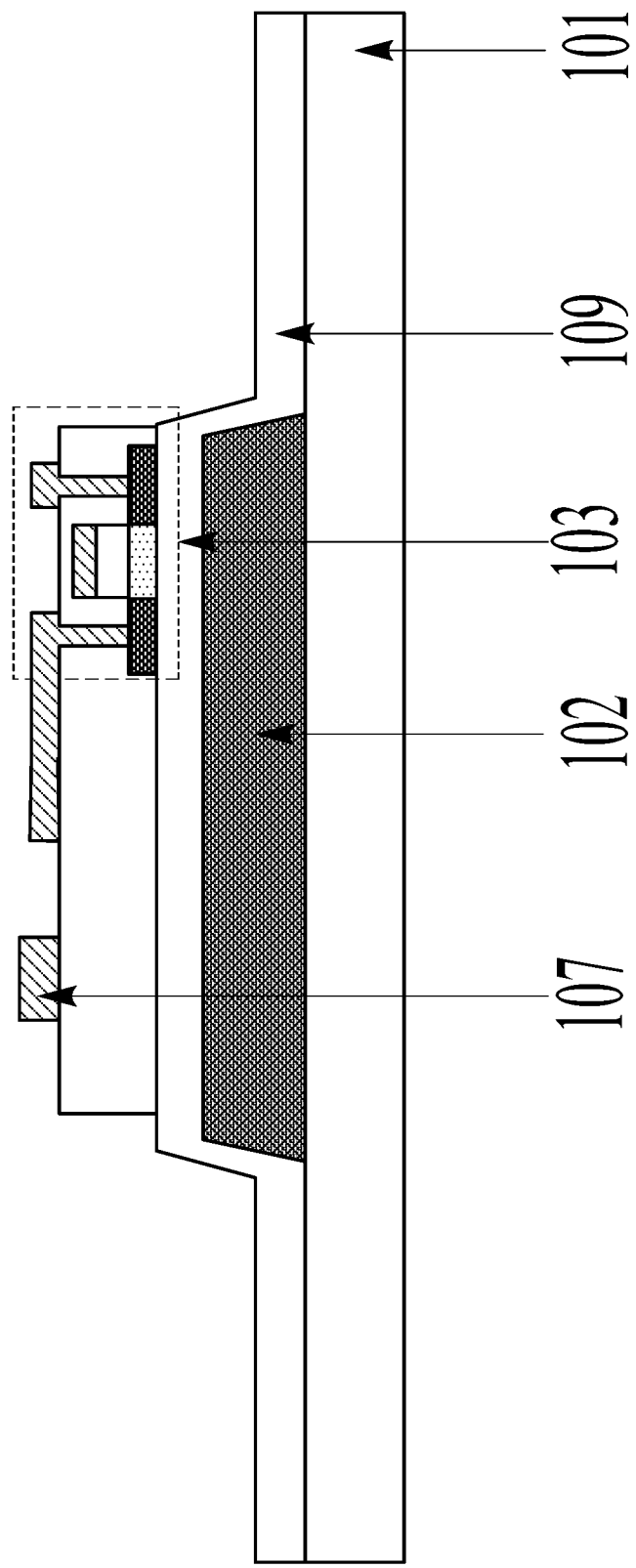

Please refer to FIG. 13, which is a schematic diagram after the switching unit 103 is formed at a side of the insulating layer 109 away from the black matrix 102 according to an embodiment of the present disclosure, an auxiliary connection trace 107 may also be formed in the process of forming the switching unit 103. Optionally, the embodiment of the present disclosure is illustrated by taking an example in which the switching unit 103 is a top gate TFT with a self-aligned structure. Step 1003 may include the following sub-steps.

In sub-step S1, an active layer is formed at a side of the insulating layer away from the black matrix.

Optionally, the material of the active layer may be polycrystalline silicon, amorphous silicon, or a semiconductor oxide, such as an indium gallium zinc oxide (IGZO).

Exemplarily, referring to FIG. 13 and in combination with FIG. 6, an IGZO material layer may be formed at a side of the insulating layer 109 away from the black matrix 102 by any one of deposition, coating, sputtering, or the like, and then the IGZO material layer is processed by a single patterning process to obtain the active layer 1033.

In sub-step S2, a gate insulating layer and a gate electrode are formed at a side of the active layer away from the black matrix.

Optionally, the material of the gate insulating layer may be one of or a combination of silicon oxide, silicon nitride and silicon oxynitride, and the material of the gate electrode may be metal Mo, metal Cu, metal Al, or an alloy material thereof.

Exemplarily, referring to FIG. 13 and in combination with FIG. 6, a silicon oxide material layer and a metal Al material layer may be sequentially formed at a side of the active layer 1033 away from the black matrix 102 by any one of deposition, coating, sputtering, or the like, and then the metal Al material layer is processed by a single patterning process to obtain the gate electrode 1035, and the silicon oxide material layer may be etched with the gate electrode 1035 as a mask to obtain the gate insulating layer. Since the gate insulating layer 1034 is formed with the gate electrode 1035 as a mask, the gate insulating layer 1034 and the gate electrode 1035 are self-aligned, and thereby the formed TFT is a TFT with a self-aligned structure.

Optionally, after the gate electrode 1035 and the gate insulating layer 1034 are formed, the portion of the active layer 1033 not covered by the gate electrode 1035 may be doped to form a doped region 1033b, and the portion of the active layer 1033 covered by the gate electrode 1035 is a channel region 1033a. Since doping may enable a semiconductor to be converted to a conductor, the conductivity of the doped region 1033b is higher than the conductivity of the channel region 1033a. In some scenarios, doping the active layer is also referred to as enabling the active layer to be conductive.

In sub-step S3, an interlayer dielectric layer is formed at a side of the gate electrode away from the black matrix.

Optionally, the material of the interlayer dielectric layer may also be one of or a combination of silicon oxide, silicon nitride and silicon oxynitride.

Exemplarily, referring to FIG. 13 and in combination with FIG. 6, a silicon nitride material layer may be formed at a side of the gate electrode 1035 away from the black matrix 102 by any one of deposition, coating, sputtering, or the like, and then the silicon nitride material layer is processed by a single patterning process to obtain the interlayer dielectric layer 1036.

In sub-step S4, a source-drain electrode layer is formed at a side of the interlayer dielectric layer away from the black matrix.

Optionally, the material of the source-drain electrode layer may be a metal material or an alloy material, such as metal Mo, metal Cu, metal Al or an alloy material thereof.

Exemplarily, referring to FIG. 13 and in combination with FIG. 6, a metal Cu material layer may be formed at a side of the interlayer dielectric layer 1036 away from the black matrix 102 by any one of deposition, coating, sputtering, or the like, and then the metal Cu material layer is processed by a single patterning process to obtain then the source-drain electrode layer. The source-drain electrode layer includes a first electrode (source electrode) 1031 and a second electrode (drain electrode) 1032. The auxiliary connection trace 107 may also be formed in the process of forming the source-drain electrode layer, and the auxiliary connection trace 107, the first electrode 1031 and the second electrode 1032 are distributed in the same layer.

In step 1004, a passivation layer is formed at a side of the switching unit away from the black matrix.

Optionally, the material of the passivation layer may be one of or a combination of silicon oxide, silicon nitride and silicon oxynitride.

Figure 14:
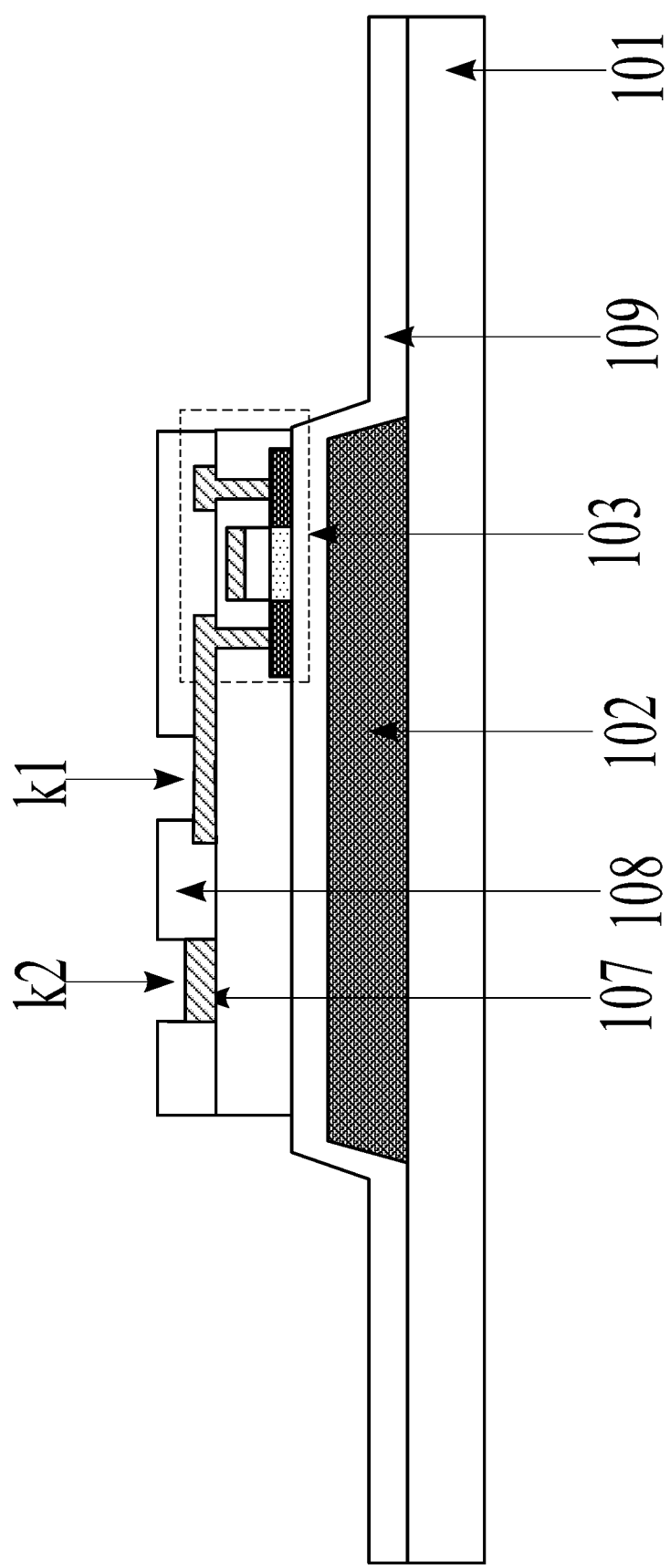

Exemplarily, please refer to FIG. 14, which is a schematic diagram after the passivation layer 108 is formed at a side of the switching unit 103 away from the black matrix 102 provided in an embodiment of the present disclosure. A silicon oxynitride material layer may be formed at a side of the switching unit 103 away from the black matrix 102 by any one of deposition, coating, sputtering, or the like, and then the silicon oxynitride material layer is processed by a single patterning process to obtain the passivation layer 108. The passivation layer 108 has a via-hole K1 and a via-hole K2. The second electrode 1032 of the switching unit 103 is at least partially exposed by the via-hole K1, and the auxiliary connection trace 107 is at least partially exposed by the via-hole K2.

In step 1005, an optical detection unit is formed at a side of the switching unit away from the black matrix.

Optionally, the optical detection unit may include a first electrode, a photosensitive layer, and a second electrode that are laminated sequentially. The photosensitive layer may include a P-type semiconductor layer, an intrinsic semiconductor layer, and an N-type semiconductor layer that are laminated sequentially. The P-type semiconductor layer may be close to or away from the first electrode with respect to the N-type semiconductor layer. The first electrode may be close to or away from the black matrix with respect to the second electrode, and one of the first electrode and second electrode away from the black matrix may be a transparent electrode.

Figure 15:
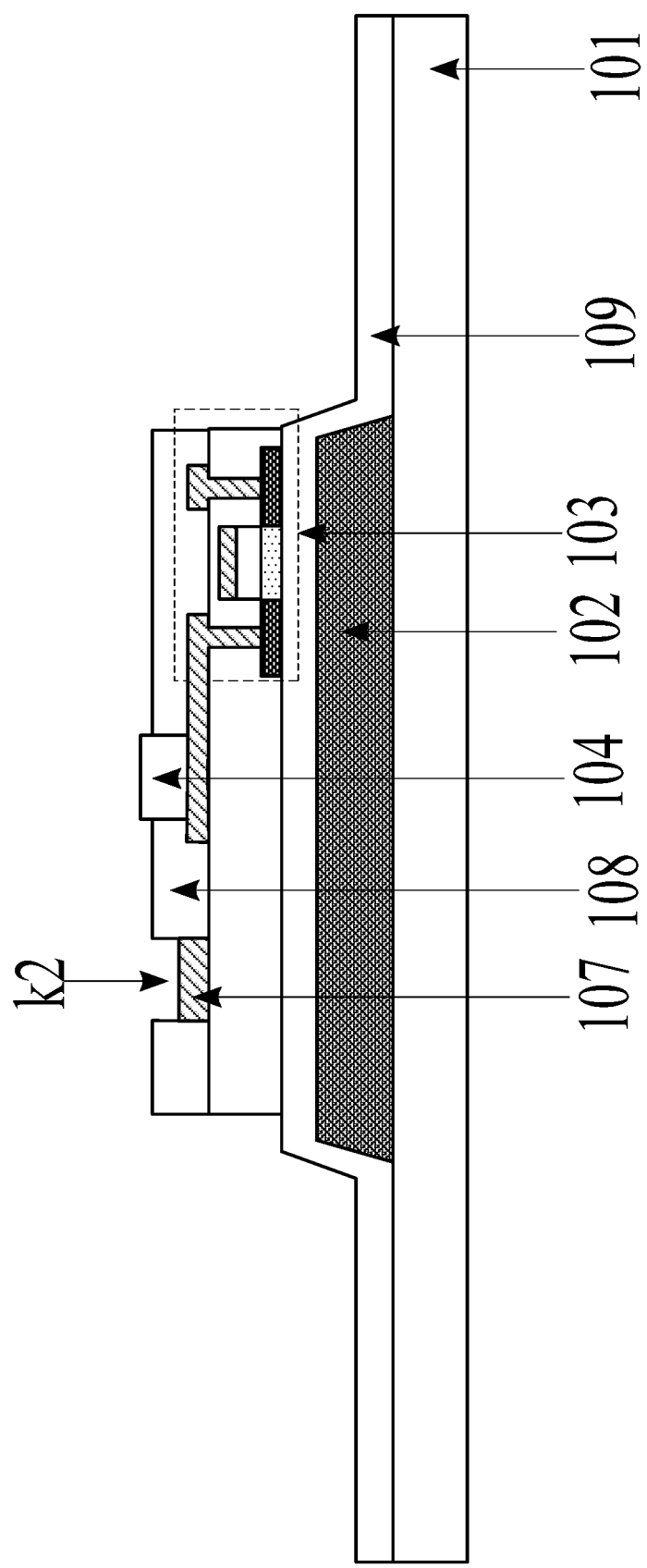

Exemplarily, please refer to FIG. 15, FIG. 15 is a schematic diagram after the optical detection unit 104 is formed at a side of the switching unit 103 away from the black matrix 102 according to an embodiment of the present disclosure. Firstly, a first electrode may be formed at a side of the switching unit 103 away from the black matrix 102. Then, an N-type semiconductor material layer, an intrinsic semiconductor material layer, and a P-type semiconductor material layer are sequentially formed by plasma enhanced chemical vapor deposition (PECVD) at a side of the first electrode away from the switching unit 103, and the N-type semiconductor material layer, the intrinsic semiconductor material layer, and the P-type semiconductor material layer are processed by a single patterning process to obtain an N-type semiconductor layer, an intrinsic semiconductor layer, and a P-type semiconductor layer that are laminated sequentially, thereby obtaining a photosensitive layer. Finally, a second electrode is formed at a side of the photosensitive layer away from the first electrode, to obtain the optical detection unit 104. At least part of the optical detection unit 104 is in the via-hole of the passivation layer 108, and the first electrode is electrically connected to the second electrode 1032 of the switching unit 103. The second electrode may be a transparent electrode, such as an ITO electrode or the like.

In step 1006, a primary connection trace is formed at a side of the optical detection unit away from the black matrix.

Optionally, the material of the primary connecting trace may be a transparent conductive material, such as one of or a combination of ITO, IZO, AZO and AZTO.

Figure 16:
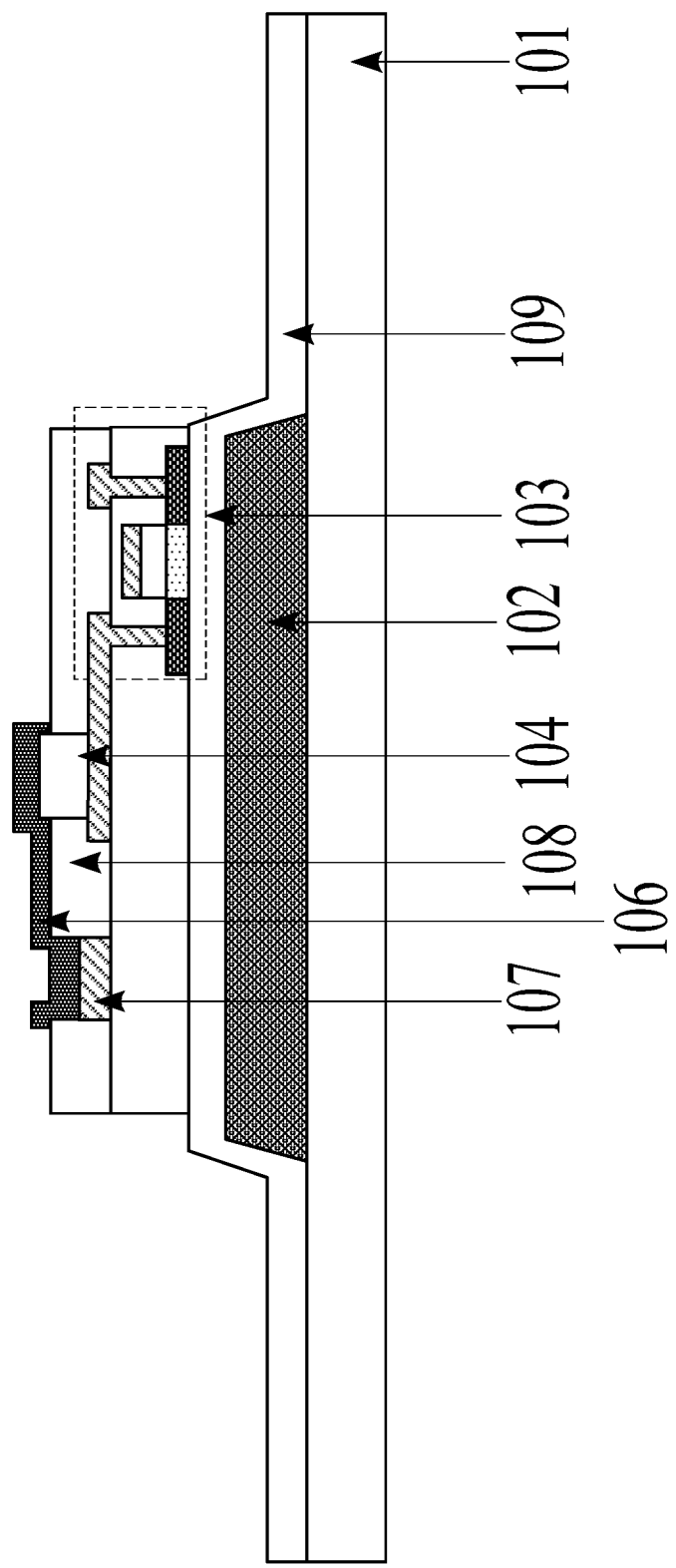

Exemplarily, please refer to FIG. 16, which is a schematic diagram after the primary connection trace 106 is formed at a side of the optical detection unit 104 away from the black matrix 102. An ITO material layer may be formed at a side of the optical detection unit 104 away from the black matrix 102 by any one of deposition, coating, sputtering, or the like, and then the ITO material layer may be processed by a single patterning process to obtain the primary connection trace 106. The primary connection trace 106 is electrically connected to the optical detection unit 104, and the primary connection trace 106 is electrically connected to the auxiliary connection trace 107 through the via-hole K2 in the passivation layer 108.

In step 1007, a color filter layer is formed at a side of the optical detection unit away from the black matrix.

Figure 17:
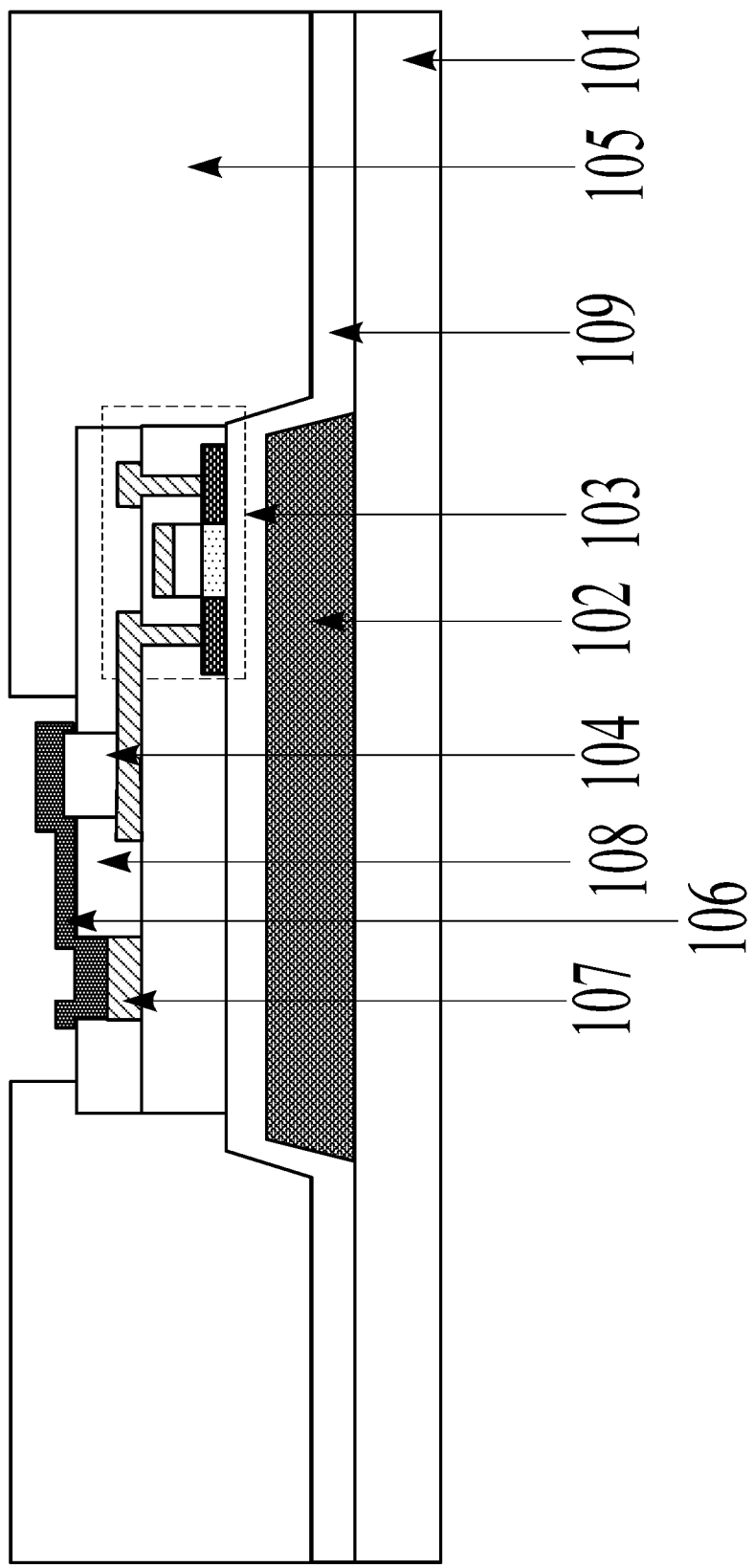

Exemplarily, please refer to FIG. 17, which is a schematic diagram after the color filter layer 105 is formed at a side of the optical detection unit 104 away from the black matrix 102 according to an embodiment of the present disclosure. The orthographic projection of the color filter layer 105 on the base substrate 101 is staggered from the orthographic projection of the optical detection unit 104 on the base substrate 101. Firstly, a red filter layer may be formed at a side of the optical detection unit 104 away from the black matrix 102, the red filter layer is processed with a single patterning process to obtain a red filter block. Then, a green filter layer may be formed at a side of the optical detection unit 104 away from the black matrix 102, and the green filter layer is processed by a single patterning process to obtain a green filter block. Finally, a blue filter layer may be formed at a side of the optical detection unit 104 away from the black matrix 102, and the blue filter layer is processed with a single patterning process to obtain a blue filter block. The red filter block, the green filter block, and the blue filter block are all in the sub-pixel region defined by the black matrix 102, and are all distributed in the same layer to form a color filter layer.

In step 1008, a protective layer, a first auxiliary cathode, a supporting column and a second auxiliary cathode are sequentially formed at a side of the color filter layer away from the base substrate.

Optionally, the material of the protective layer may be one of or a combination of silicon oxide, silicon nitride and silicon oxynitride. The material of the supporting column may be resin. The material of the first auxiliary cathode may be a metal material, such as metal Mo, metal Al, metal Au, metal Cu, metal Hf, metal Ta or metal Ti, or an alloy material, such as MoNb alloy or AlNd alloy. The first auxiliary cathode may be a one-layer or multi-layer structure. For example, the first auxiliary cathode is a multi-layer structure formed by a MoNb alloy layer, a metal Cu layer, and a MoNb alloy layer. Alternatively, the first auxiliary cathode 111 is a multi-layer structure formed by an AlNd alloy layer, a metal Mo layer, and an AlNd alloy layer. The material of the second auxiliary cathode may be a transparent conductive material, such as one of or a combination of IZO, AZO and AZTO. The first auxiliary cathode is electrically connected to the second auxiliary cathode, and the first auxiliary cathode is configured to reduce the resistance of the second auxiliary cathode.

Exemplarily, reference may be made to FIG. 6 for the schematic diagram after the protective layer 110, the first auxiliary cathode 111, the supporting column 112, and the second auxiliary cathode 113 are sequentially formed at a side of the color filter layer 105 away from the base substrate 101. Firstly, a layer of silicon oxide may be deposited as the protective layer 110 at a side of the color filter layer 105 away from the base substrate 101 by any one of deposition, coating, sputtering, or the like. Afterwards, a metal Al material layer may be formed at a side of the protective layer 110 away from the base substrate 101 by any one of deposition, coating, sputtering, or the like, and the metal Al material layer is processed by a single patterning process to obtain the first auxiliary cathode 111. Then, a resin material layer may be formed at a side of the first auxiliary cathode 111 away from the protective layer 110 by any one of deposition, coating, sputtering, or the like, and the resin material layer is processed by a single patterning process to obtain the supporting column 112. Finally, an ITO material layer may be formed at a side of the supporting column 112 away from the first auxiliary cathode 111 by any one of deposition, coating, sputtering, or the like, and the ITO material layer is processed by a single patterning process to obtain the second auxiliary cathode 113.

The sequence of steps in the method for manufacturing the display substrate according to the embodiments of the present disclosure may be appropriately adjusted, and the steps may also be correspondingly added or deleted according to the situation. Any variations of the methods that can be easily conceived by any one skilled in the art within the technical scope disclosed in the present disclosure shall be included in the protection scope of the present disclosure, and therefore will not be described again. In addition, the single patterning process in the embodiments of the present disclosure may include photoresist coating, exposure, development, etching, and photoresist stripping.

In summary, with the method for manufacturing the display substrate according to the embodiments of the present disclosure, the switching unit and the optical detection unit are at a side of the black matrix away from the base substrate, and the orthographic projection of at least one of the switching unit and the optical detection unit on the base substrate is within the orthographic projection of the black matrix on the base substrate, which helps reduce the influence caused by the switching unit and the optical detection unit on the aperture ratio of the display substrate, thereby increasing the aperture ratio of the display substrate.

In addition, since the orthographic projection of the color filter layer on the base substrate is staggered from the orthographic projection of the optical detection unit on the base substrate, the color filter layer may be prevented from shielding the optical detection unit, so that the light may irradiate to the optical detection unit without the need to pass through the color filter layer. Thus, the light emitting luminance detected by the optical detection unit is closer to the actual light emitting luminance of the sub-pixel region. The accuracy of the luminance of the light detected by the optical detection unit is high, which helps improve the accuracy in compensating the luminance of the display substrate according to the light emitting luminance detected by the optical detection unit, and thereby improve the display effect of the display substrate.

Based on the same inventive concept, the embodiments of the present disclosure further provides a display device. The display device may include the display panel provided in the above embodiments. For example, the display device includes the display substrate as shown in FIG. 8. Furthermore, the display device may further include an optical compensating IC. The optical compensating IC and the connection between the optical compensating IC and the optical detection unit in the display device have been clearly described in the above embodiments, and are not described herein again.

The display device may be an electroluminescent display device, such as an OLED display device or a QLED display device. The display device may be any product or component having a display function, such as a piece of electronic paper, a mobile phone, a tablet computer, a TV set, a display, a notebook computer, a digital photo frame, a navigator, etc.

Persons of ordinary skill in the art can understand that all or part of the steps described in the above embodiments can be completed through hardware, or through relevant software instructed by application stored in a non-transitory computer readable storage medium, such as read-only memory, disk or CD, etc.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A display substrate, comprising:
   a base substrate;
   a black matrix on the base substrate;
   a switching unit and an optical detection unit at a side of the black matrix away from the base substrate, wherein the optical detection unit is electrically connected to the switching unit, and an orthographic projection of at least one of the switching unit and the optical detection unit on the base substrate is within an orthographic projection of the black matrix on the base substrate; and
   a color filter layer at a side of the switching unit away from the black matrix, wherein an orthographic projection of the color filter layer on the base substrate is staggered from an orthographic projection of the optical detection unit on the base substrate.

2. The display substrate according to claim 1, wherein an orthographic projection of the switching unit on the base substrate and an orthographic projection of the optical detection unit on the base substrate are both within an orthographic projection of the black matrix on the base substrate.

3. The display substrate according to claim 2, wherein the switching unit and the optical detection unit are distributed in a direction away from the base substrate, and the display substrate further comprises:
   a passivation layer at a side of the switching unit away from the black matrix, wherein the passivation layer has a via-hole and at least part of the optical detection unit is in the via hole;
   a color filter layer at a side of the passivation layer away from the switching unit, wherein an orthographic projection of the color filter layer on the base substrate is staggered from an orthographic projection of the optical detection unit on the base substrate;
   a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit; and
   an insulating layer between the black matrix and the switching unit, and a protective layer, a first auxiliary cathode, a supporting column and a second auxiliary cathode at a side of the color filter layer away from the base substrate, wherein the protective layer, the first auxiliary cathode, the supporting column and the second auxiliary cathode are distributed in a direction away from the base substrate, and the first auxiliary cathode is electrically connected to the second auxiliary cathode;
   wherein the switching unit is a thin film transistor and comprises an active layer, a gate insulating layer, a gate electrode, an interlayer dielectric layer, and a source-drain electrode layer that are sequentially distributed in a direction away from the black matrix, wherein an orthographic projection of the active layer on the base substrate is within an orthographic projection of the color filter layer on the base substrate, and the source-drain electrode layer comprises a source electrode and a drain electrode; the optical detection unit is electrically connected to the drain electrode; the auxiliary connection trace, the source electrode, and the drain electrode are distributed in the same layer; the optical detection unit is a photodiode, and a photosensitive surface of the optical detection unit is a surface of the optical detection unit away from the black matrix.

4. The display substrate according to claim 1, wherein the switching unit comprises: an active layer, wherein an orthographic projection of the active layer on the base substrate is within the orthographic projection of the color filter layer on the base substrate.

5. The display substrate according to claim 1, further comprising:
   a primary connection trace at a side of the optical detection unit away from the black matrix, and an auxiliary connection trace electrically connected to the primary connection trace, wherein the primary connection trace is electrically connected to the optical detection unit and configured to apply an operating voltage to the optical detection unit.

6. The display substrate according to claim 5, wherein the switching unit comprises:
   a first electrode and a second electrode, wherein the optical detection unit is electrically connected to one of the first electrode and the second electrode, and the auxiliary connection trace, the first electrode, and the second electrode are disposed in the same layer.

7. The display substrate according to claim 6, wherein the switching unit is a thin film transistor, and comprises an active layer, a gate insulating layer, a gate electrode, an interlayer dielectric layer, and a source-drain electrode layer that are sequentially distributed in a direction away from the black matrix, wherein the source-drain electrode layer comprises a source electrode and a drain electrode, the first electrode is the source electrode, the second electrode is the drain electrode, and the optical detection unit is electrically connected to the second electrode.

8. The display substrate according to claim 1, wherein the optical detection unit is a photodiode, and a photosensitive surface of the optical detection unit is a surface of the optical detection unit away from the black matrix.

9. The display substrate according to claim 1, wherein the switching unit and the optical detection unit are distributed in a direction away from the black matrix, and the display substrate further comprises: a passivation layer at a side of the switching unit away from the black matrix, wherein the passivation layer has a via-hole and at least part of the optical detection unit is in the via hole.

10. The display substrate according to claim 1, further comprising:
an insulating layer between the black matrix and the switching unit, and a protective layer, a first auxiliary cathode, a supporting column, and a second auxiliary cathode at a side of the color filter layer away from the base substrate, wherein the protective layer, the first auxiliary cathode, the supporting column, and the second auxiliary cathode are distributed in a direction away from the base substrate, and the first auxiliary cathode is electrically connected to the second auxiliary cathode.

11. A method for manufacturing a display substrate, comprising:
forming a black matrix on a base substrate;
forming a switching unit at a side of the black matrix away from the base substrate;
forming an optical detection unit at a side of the switching unit away from the black matrix, wherein the optical detection unit is electrically connected to the switching unit, and an orthographic projection of at least one of the switching unit and the optical detection unit on the base substrate is within an orthographic projection of the black matrix on the base substrate; and
forming a color filter layer at a side of the switching unit away from the black matrix, wherein an orthographic projection of the color filter layer on the base substrate is staggered from an orthographic projection of the optical detection unit on the base substrate.

12. The method according to claim 11, further comprising:
forming a primary connection trace at a side of the optical detection unit away from the black matrix, wherein the primary connection trace is electrically connected to an auxiliary connection trace and the optical detection unit, respectively; and the switching unit comprises a first electrode and a second electrode, wherein the optical detection unit is electrically connected to one of the first electrode and the second electrode, and the auxiliary connection trace, the first electrode, and the second electrode are distributed in the same layer.

13. The method according to claim 12, wherein
prior to forming an optical detection unit at a side of the switching unit away from the black matrix, the method further comprises:
forming a passivation layer at a side of the switching unit away from the black matrix, wherein the passivation layer has a via-hole; and
forming an optical detection unit at a side of the switching unit away from the black matrix comprises:
forming an optical detection unit at a side of the switching unit away from the black matrix, wherein at least part of the optical detection unit is in the via-hole.

14. The method according to claim 13, wherein
prior to forming a switching unit at a side of the black matrix away from the base substrate, the method further comprises:
forming an insulating layer at a side of the black matrix away from the base substrate;
forming a switching unit at a side of the black matrix away from the base substrate comprises:
forming a switching unit at a side of the insulating layer away from the black matrix; and
after forming a color filter layer at a side of the switching unit away from the black matrix, the method further comprises:
sequentially forming a protective layer, a first auxiliary cathode, a supporting column and a second auxiliary cathode at a side of the color filter layer away from the base substrate, wherein the first auxiliary cathode is electrically connected to the second auxiliary cathode.

15. A display panel, comprising: a display substrate;
wherein the display substrate comprises: a base substrate;
a black matrix on the base substrate;
a switching unit and an optical detection unit at a side of the black matrix away from the base substrate, wherein the optical detection unit is electrically connected to the switching unit, and an orthographic projection of at least one of the switching unit and the optical detection unit on the base substrate is within an orthographic projection of the black matrix on the base substrate; and
a color filter layer at a side of the switching unit away from the black matrix, wherein an orthographic projection of the color filter layer on the base substrate is staggered from an orthographic projection of the optical detection unit on the base substrate.

16. The display panel according to claim 15, wherein
the display panel further comprises a display back plate facing the display substrate;
wherein the display back plate comprises: a light emitting unit and a driving unit, wherein the light emitting unit is electrically connected to the driving unit, and an orthographic projection of the optical detection unit on the base substrate is within an orthographic projection of the light emitting unit on the base substrate.

17. The display panel according to claim 16, wherein
the display substrate comprises a first auxiliary cathode and a second auxiliary cathode, wherein the first auxiliary cathode is electrically connected to the second auxiliary cathode; and the light emitting unit comprises an anode, a light emitting layer, and a cathode that are stacked sequentially, wherein the cathode is in contact with the second auxiliary cathode.

18. A display device, comprising the display panel of claim 15.

* * * * *